(12) United States Patent
Vincent et al.

(10) Patent No.: US 12,484,331 B2
(45) Date of Patent: Nov. 25, 2025

(54) ENABLING SENSOR TOP SIDE WIREBONDING

(71) Applicant: Illumina, Inc., San Diego, CA (US)

(72) Inventors: Ludovic Vincent, San Diego, CA (US); Tara Bozorg-Grayeli, Woodside, CA (US); Arvin Emadi, San Diego, CA (US); Vanessa Montaño Machado, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 990 days.

(21) Appl. No.: 17/574,358

(22) Filed: Jan. 12, 2022

(65) Prior Publication Data

US 2022/0231068 A1 Jul. 21, 2022

Related U.S. Application Data

(60) Provisional application No. 63/137,962, filed on Jan. 15, 2021.

(51) Int. Cl.
*H10F 39/00* (2025.01)
*G01N 27/414* (2006.01)
(Continued)

(52) U.S. Cl.
CPC ......... *H10F 39/811* (2025.01); *G01N 27/414* (2013.01); *G01N 33/5438* (2013.01);
(Continued)

(58) Field of Classification Search
None
See application file for complete search history.

(56) References Cited

U.S. PATENT DOCUMENTS 4,486,945 A * 12/1984 Aigoo ................ H01L 23/3142
29/841
6,548,895 B1 * 4/2003 Benavides .......... H01L 23/4334
257/784
(Continued)

FOREIGN PATENT DOCUMENTS

CN 109283236 A 1/2019
EP 1591780 A2 11/2005
(Continued)

OTHER PUBLICATIONS

Datta-Chaudhuri, T., et al., "Packaging Commercial CMOS Chips for Lab on a Chip Integration," Lab Chip, vol.

*Primary Examiner* — Cory W Eskridge
(74) *Attorney, Agent, or Firm* — Heslin Rothenberg Farley & Mesiti P.C.

(57) ABSTRACT

Provided herein include various examples of an apparatus, a sensor system and examples of a method for manufacturing aspects of an apparatus, a sensor system. The method may include forming bumps on a surface of one or more electrical contacts, where the one or more electrical contacts are accessible on an upper surface of a die, where the die is oriented on a substrate, and where the electrical contacts comprise bonding pads. The method may also include coupling one or more additional electrical contacts to the one or more electrical contacts, where the coupling comprises wire-bonding each additional electrical contact of the additional electrical contacts to one of the one or more electrical contacts accessible on the upper surface of the die, via a portion of the bumps on the surface of the one or more electrical contacts, thereby forming wire-bonded connections.

19 Claims, 14 Drawing Sheets

(51) Int. Cl.
 *G01N 33/543* (2006.01)
 *H01L 23/00* (2006.01)
 *G03F 7/38* (2006.01)

(52) U.S. Cl.
 CPC ............ *H01L 24/48* (2013.01); *H10F 39/011* (2025.01); *H10F 39/804* (2025.01); *G03F 7/38* (2013.01); *H01L 2224/48227* (2013.01)

(56) References Cited

U.S. PATENT DOCUMENTS

| | | | |
|---|---|---|---|
| 6,956,283 | B1 * | 10/2005 | Peterson ............ B81C 1/00801 257/784 |
| 7,081,404 | B2 | 7/2006 | Jan et al. |
| 8,115,511 | B2 | 2/2012 | Or-Bach |
| 8,536,672 | B2 | 9/2013 | Chang et al. |
| 8,796,746 | B2 | 8/2014 | Yang |
| 8,871,549 | B2 | 10/2014 | Ellis-Monaghan et al. |
| 9,079,179 | B2 | 7/2015 | Wimberger-Friedl et al. |
| 9,670,445 | B1 | 6/2017 | Kuo et al. |
| 2001/0051431 | A1 | 12/2001 | Chadda et al. |
| 2004/0043423 | A1 | 3/2004 | Bellew et al. |
| 2005/0006739 | A1 * | 1/2005 | Howard ................. H01L 23/13 257/738 |
| 2006/0010964 | A1 | 1/2006 | Sparks et al. |
| 2007/0122314 | A1 | 5/2007 | Strand et al. |
| 2009/0280602 | A1 | 11/2009 | Bonifield et al. |
| 2013/0105868 | A1 | 5/2013 | Kalnitsky et al. |
| 2014/0077315 | A1 | 3/2014 | Bischopink et al. |
| 2016/0043240 | A1 | 2/2016 | Oganesian et al. |
| 2016/0186166 | A1 | 6/2016 | Poehmerer et al. |
| 2016/0329067 | A1 | 11/2016 | Fischer et al. |
| 2016/0356175 | A1 | 12/2016 | Waddington |
| 2017/0023512 | A1 | 1/2017 | Cummins et al. |
| 2018/0095039 | A1 | 4/2018 | Cao et al. |
| 2018/0130760 | A1 | 5/2018 | Wang et al. |
| 2018/0312399 | A1 * | 11/2018 | Singh ................. B81C 1/00039 |
| 2018/0341649 | A1 | 11/2018 | Eltoukhy et al. |
| 2019/0070606 | A1 | 3/2019 | Li et al. |
| 2020/0066684 | A1 * | 2/2020 | Fung ....................... H01L 24/91 |
| 2020/0164645 | A1 * | 5/2020 | Cumbie ................ B41J 2/1637 |

FOREIGN PATENT DOCUMENTS

| | | |
|---|---|---|
| EP | 2714935 B1 | 3/2017 |
| EP | 2785868 B1 | 12/2017 |
| JP | 2016-008823 A | 1/2016 |
| JP | 2019505761 A | 2/2019 |
| WO | 2015089092 A1 | 6/2015 |
| WO | 2016168996 A1 | 10/2016 |
| WO | 2017123533 A1 | 7/2017 |
| WO | 2018071467 A1 | 4/2018 |
| WO | 2019125689 A1 | 6/2019 |
| WO | 2019152425 A1 | 8/2019 |
| WO | 2020236945 A1 | 11/2020 |

* cited by examiner

ENABLING SENSOR TOP SIDE WIREBONDING

BACKGROUND

Various protocols in biological or chemical research involve performing controlled reactions. The designated reactions can then be observed or detected and subsequent analysis can help identify or reveal properties of chemicals involved in the reaction. In some multiplex assays, an unknown analyte having an identifiable label (e.g., fluorescent label) can be exposed to thousands of known probes under controlled conditions. Each known probe can be deposited into a corresponding well of a microplate. Observing any chemical reactions that occur between the known probes and the unknown analyte within the wells can help identify or reveal properties of the analyte. Other examples of such protocols include known DNA sequencing processes, such as sequencing-by-synthesis (SBS) or cyclic-array sequencing.

In some fluorescent-detection protocols, an optical system is used to direct excitation light onto fluorophores, e.g., fluorescently-labeled analytes and to also detect the fluorescent emissions signal light that can emit from the analytes having attached fluorophores. In other proposed detection systems, the controlled reactions in a flow cell are detected by a solid-state light sensor array (e.g., a complementary metal oxide semiconductor (CMOS) detector). These systems do not involve a large optical assembly to detect the fluorescent emissions. The shape of the fluidic flow channel in a flow cell may determine its utility for various uses, for example, SBS or cyclic-array sequencing is enabled in a sensor system utilizing multiple liquid flows, and thus, a fluidic flow channel of specific shape is utilized for SBS or cyclic-array sequencing.

In order to enable SBS in the above described optical systems, electrical contacts are provided to a sensor in the system (e.g., a CMOS utilized as a detector) in certain of the described optical systems. Although providing at a position close to an active surface of a sensor in a flow cell would appear to be a more cost effective and simpler configuration, certain elements in existing fabrication processes for optical systems could damage electrical contacts in this position, so many optical systems employ alternate locations for these contacts.

SUMMARY

Accordingly, it may be beneficial for a flow cell fabrication mechanism to enable electrical contacts to be located on a side of an optical system that also includes an active surface of a sensor in the system.

Thus, shortcomings of the prior art can be overcome and benefits as described later in this disclosure can be achieved through the provision of a method for enabling topside bonding to sensors on dies. Various examples of the method are described below, and the method, including and excluding the additional examples enumerated below, in any combination (provided these combination are not inconsistent), overcome these shortcomings. The method comprises: forming bumps on a surface of one or more electrical contacts, wherein the one or more electrical contacts are accessible on an upper surface of a die, where the die is oriented on a substrate, and wherein the electrical contacts comprise bonding pads; and coupling additional electrical contacts to the one or more electrical contacts, wherein the coupling comprises wire-bonding each additional electrical contact of the additional electrical contacts to one of the one or more electrical contacts accessible on the upper surface of the die, via a portion of the bumps on the surface of the one or more electrical contacts, thereby forming wire-bonded connections.

In some examples, the die is oriented on a substrate such that a first space is defined in a cavity adjacent to a first edge of the upper surface of the die and a second space is defined in a cavity adjacent to a second edge of the upper surface of the die, and wherein an under-fill layer comprises a cavity between the lower surface of the die and the substrate.

In some examples, the one or more electrical contacts comprise aluminum.

In some examples, the die comprises a complementary metal-oxide-semiconductor (CMOS).

In some examples, an active surface of the die comprises a portion of the upper surface of the die comprising nanowells, the one or more contacts are adjacent to the active surface, and forming the bumps comprises: removing a top oxide layer from the upper surface of the die; forming a seed layer over the upper surface of the die; implementing and patterning a photoresist on the active surface of the die, where the seed layer is exposed on portions of the upper surface without the patterned photoresist; and electroplating a metal layer over the exposed seed layer, where the electroplating comprises implementing the metal layer over the one or more electrical contacts.

In some examples, the method also includes prior to forming the seed layer, forming and patterning an initial photoresist over the active surface of the die.

In some examples, the method also includes removing the photoresist.

In some examples, the active surface comprises a nanowell array, and the method further comprises: removing the seed layer from the active surface by utilizing an etchant that preserves the nanowell array.

In some examples, the method also includes removing the initial photoresist from over the active surface of the die.

In some examples removing the photoresist comprises using ultraviolet (UV) light to break down photoresist crosslinks and removing the photoresist by applying a developer to the die.

In some examples, forming the seed layer comprises sputtering a material over the upper surface of the die.

In some examples, the seed layer is comprised of metal.

In some examples, a material comprising the seed layer is selected from the group consisting of: titanium tungsten (TiW), copper (Cu), titanium copper (TiCu), and titanium (Ti).

In some examples, a material comprising the bumps is selected from the group consisting of: gold (Au), platinum (Pt), copper (Cu), and nickel (Ni).

In some examples, the method also includes coating the die with a polymeric material; and polishing at least a portion of the coating.

In some examples, the one or more additional electrical contacts comprise substrate bonding pads and the one or more electrical contacts comprise die bonding pads.

In some examples, the die comprises coated and polished nanowells.

Shortcomings of the prior art can be overcome and benefits as described later in this disclosure can be achieved through the provision of an apparatus for enabling topside bonding to sensors on dies. Various examples of the apparatus are described below, and the apparatus, including and excluding the additional examples enumerated below, in any combination (provided these combination are not inconsistent), overcome these shortcomings. The apparatus includes: a substrate comprising a die, wherein the die is oriented on the substrate, wherein one or more electrical contacts comprising bonding pads are oriented on an upper surface of the die, and wherein a portion of an upper surface of each of the one or more electrical contacts is layered with a coating comprising metal bumps; one or more additional electrical contacts, each of the one or more additional electrical contacts electrically coupled, via a wire bond, to at least one electrical contact of the or more one or more electrical contacts, via a portion of the metal bumps on the at least one contact; and a fluidic flow channel over an active surface of the die, where the active surface of the die comprises a portion of the upper surface of the die comprising nanowells, where the one or more electrical contacts are adjacent to the active surface.

In some examples, the metal of the metal coating is selected from the group consisting of: gold (Au), platinum (Pt), copper (Cu), and nickel (Ni).

In some examples, the die comprises a complementary metal-oxide-semiconductor (CMOS).

Shortcomings of the prior art can be overcome and benefits as described later in this disclosure can be achieved through the provision of a method for enabling topside bonding to sensors on dies. Various examples of the method are described below, and the method, including and excluding the additional examples enumerated below, in any combination (provided these combination are not inconsistent), overcome these shortcomings. The method comprises: forming bumps on a surface of one or more electrical contacts comprising bonding pads, wherein the one or more electrical contacts are accessible on an upper surface of a sensor utilized in a flow cell, wherein a portion of a top surface of the sensor comprises an active surface, wherein the one or more bonding pads are located adjacent to the active surface, the forming comprising: removing a top oxide layer from the upper surface of the sensor; forming a seed layer over the upper surface of the sensor; implementing and patterning a photoresist on the active surface of the sensor, wherein the seed layer is exposed on portions of the upper surface without the patterned photoresist; and electroplating a metal layer over the exposed seed layer, wherein the electroplating comprises implementing the metal layer over the one or more bonding pads.

In some examples, the method also includes: prior to forming the seed layer, forming and patterning an initial photoresist over the active surface of the sensor.

In some examples, the method also includes: removing the photoresist from the portion of the upper surface.

In some examples, the active surface comprises a nanowell array, and the method further comprising: removing the seed layer from the active surface by utilizing an etchant that preserves the nanowell array.

In some examples, the method also includes removing the initial photoresist from over the active surface of the sensor.

In some examples, removing the photoresist comprises using ultraviolet (UV) light to break down photoresist crosslinks and removing the photoresist by applying a developer to the sensor.

In some examples, forming the seed layer comprises sputtering a material over the upper surface of the sensor.

In some examples, a material comprising the seed layer is selected from the group consisting of: titanium tungsten (TiW), copper (Cu), titanium copper (TiCu), and titanium (Ti).

In some examples, a material comprising the bumps is selected from the group consisting of: gold (Au), platinum (Pt), copper (Cu), and nickel (Ni).

In some examples, the method includes coating the die with a polymeric material; and polishing at least a portion of the coating.

In some examples, the method also includes: utilizing the bumps on the bonding pads to couple additional electrical contacts to the bonding pads, wherein the coupling comprises wire-bonding each additional electrical contact of the additional electrical contacts, to one of the bonding pads on the surface of the sensor, via the bumps, thereby forming wire-bonded connections.

In some examples, the sensor comprises a complementary metal-oxide-semiconductor.

In some examples, the active surface comprises coated and polished nanowells.

Shortcomings of the prior art can be overcome and benefits as described later in this disclosure can be achieved through the provision of a method for enabling topside bonding to sensors on dies. Various examples of the method are described below, and the method, including and excluding the additional examples enumerated below, in any combination (provided these combination are not inconsistent), overcome these shortcomings. The method comprises: forming bumps on a surface of one or more bonding pads, where the one or more bonding pads are accessible on an upper surface of a sensor utilized in a flow cell, where a portion of a top surface of the sensor comprises an active surface, where the one or more bonding pads are located adjacent to the active surface, the forming comprising: removing a top oxide layer from the upper surface of the sensor; forming a seed layer over the upper surface of the sensor, where the forming forms a first portion of the seed layer on the one or more bonding pads and a second portion of the seed layer on the active surface; implementing and patterning a first photoresist on one or more bonding pads; removing the second portion of the seed layer; implementing and patterning a second photoresist on the active surface of the sensor; electroplating a metal layer over the first portion of the seed layer, where the electroplating comprises implementing the metal layer over the one or more bonding pads; stripping the second photoresist; and stripping a section of the first portion of the seed layer, where the section is not covered by the metal layer.

In some examples, the method also includes: utilizing the bumps on the bonding pads to couple exposed electrical contacts to the bonding pads, where the coupling comprises wire-bonding each exposed electrical contact of the exposed electrical contacts, to one of the bonding pads on the surface of the sensor, thereby forming wire-bonded connections.

Additional features are realized through the techniques described herein. Other examples and aspects are described in detail herein and are considered a part of the claimed aspects. These and other objects, features and advantages of this disclosure will become apparent from the following detailed description of the various aspects of the disclosure taken in conjunction with the accompanying drawings.

It should be appreciated that all combinations of the foregoing aspects and additional concepts discussed in greater detail below (provided such concepts are not mutually inconsistent) are contemplated as being part of the inventive subject matter and to achieve the advantages disclosed herein.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
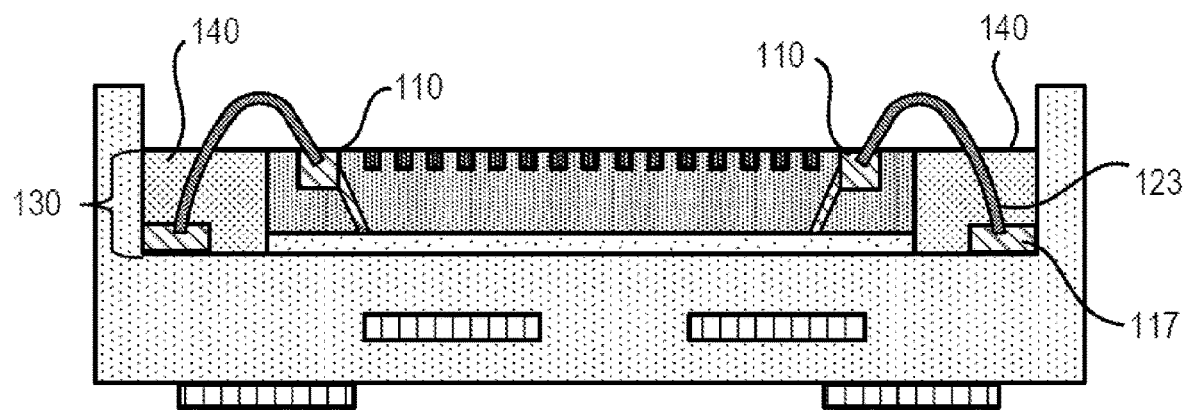
FIGS. 1-2 depict examples of portion of flow cells that include topside wire bonded electrical contacts.

The accompanying figures, in which like reference numerals refer to identical or functionally similar elements throughout the separate views and which are incorporated in and form a part of the specification, further illustrate the present implementation and, together with the detailed description of the implementation, serve to explain the principles of the present implementation. As understood by one of skill in the art, the accompanying figures are provided for ease of understanding and illustrate aspects of certain examples of the present implementation. The implementation is not limited to the examples depicted in the figures.

The terms "connect," "connected," "contact" "coupled" and/or the like are broadly defined herein to encompass a variety of divergent arrangements and assembly techniques. These arrangements and techniques include, but are not limited to (1) the direct joining of one component and another component with no intervening components therebetween (i.e., the components are in direct physical contact); and (2) the joining of one component and another component with one or more components therebetween, provided that the one component being "connected to" or "contacting" or "coupled to" the other component is somehow in operative communication (e.g., electrically, fluidly, physically, optically, etc.) with the other component (notwithstanding the presence of one or more additional components therebetween). It is to be understood that some components that are in direct physical contact with one another may or may not be in electrical contact and/or fluid contact with one another. Moreover, two components that are electrically connected, electrically coupled, optically connected, optically coupled, fluidly connected or fluidly coupled may or may not be in direct physical contact, and one or more other components may be positioned therebetween.

The terms "including" and "comprising", as used herein, mean the same thing.

The terms "substantially", "approximately", "about", "relatively", or other such similar terms that may be used throughout this disclosure, including the claims, are used to describe and account for small fluctuations, such as due to variations in processing, from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. If used herein, the terms "substantially", "approximately", "about", "relatively," or other such similar terms may also refer to no fluctuations, that is, ±0%.

As used herein, a "flow cell" can include a device having a lid extending over a reaction structure to form a flow channel therebetween that is in communication with a plurality of reaction sites of the reaction structure, and can include a detection device that detects designated reactions that occur at or proximate to the reaction sites. A flow cell may include a solid-state light detection or "imaging" device, such as a Charge-Coupled Device (CCD) or Complementary Metal-Oxide Semiconductor (CMOS) (light) detection device. As one specific example, a flow cell can fluidically and electrically couple to a cartridge (having an integrated pump), which can fluidically and/or electrically couple to a bioassay system. A cartridge and/or bioassay system may deliver a reaction solution to reaction sites of a flow cell according to a predetermined protocol (e.g., sequencing-by-synthesis), and perform a plurality of imaging events. For example, a cartridge and/or bioassay system may direct one or more reaction solutions through the flow channel of the flow cell, and thereby along the reaction sites. At least one of the reaction solutions may include four types of nucleotides having the same or different fluorescent labels. In some examples, the nucleotides bind to the reaction sites of the flow cell, such as to corresponding oligonucleotides at the reaction sites. The cartridge and/or bioassay system in these examples then illuminates the reaction sites using an excitation light source (e.g., solid-state light sources, such as light-emitting diodes (LEDs)). In some examples, the excitation light has a predetermined wavelength or wavelengths, including a range of wavelengths. The fluorescent labels excited by the incident excitation light may provide emission signals (e.g., light of a wavelength or wavelengths that differ from the excitation light and, potentially, each other) that may be detected by the light sensors of the flow cell.

Flow cells described herein perform various biological or chemical processes. More specifically, the flow cells described herein may be used in various processes and systems where it is desired to detect an event, property, quality, or characteristic that is indicative of a designated reaction. For example, flow cells described herein may include or be integrated with light detection devices, sensors, including but not limited to, biosensors, and their components, as well as bioassay systems that operate with sensors, including biosensors.

The flow cells facilitate a plurality of designated reactions that may be detected individually or collectively. The flow cells perform numerous cycles in which the plurality of designated reactions occurs in parallel. For example, the flow cells may be used to sequence a dense array of DNA features through iterative cycles of enzymatic manipulation and light or image detection/acquisition. As such, the flow cells may be in fluidic communication with one or more microfluidic channels that deliver reagents or other reaction components in a reaction solution to a reaction site of the flow cells. The reaction sites may be provided or spaced apart in a predetermined manner, such as in a uniform or repeating pattern. Alternatively, the reaction sites may be randomly distributed. Each of the reaction sites may be associated with one or more light guides and one or more light sensors that detect light from the associated reaction site. In one example, light guides include one or more filters for filtering certain wavelengths of light. The light guides may be, for example, an absorption filter (e.g., an organic absorption filter) such that the filter material absorbs a certain wavelength (or range of wavelengths) and allows at least one predetermined wavelength (or range of wavelengths) to pass therethrough. In some flow cells, the reaction sites may be located in reaction recesses or chambers, which may at least partially compartmentalize the designated reactions therein.

As used herein, a "designated reaction" includes a change in at least one of a chemical, electrical, physical, or optical property (or quality) of a chemical or biological substance of interest, such as an analyte-of-interest. In particular flow cells, a designated reaction is a positive binding event, such as incorporation of a fluorescently labeled biomolecule with an analyte-of-interest, for example. More generally, a designated reaction may be a chemical transformation, chemical change, or chemical interaction. A designated reaction may also be a change in electrical properties. In particular flow cells, a designated reaction includes the incorporation of a fluorescently-labeled molecule with an analyte. The analyte may be an oligonucleotide and the fluorescently-labeled molecule may be a nucleotide. A designated reaction may be detected when an excitation light is directed toward the oligonucleotide having the labeled nucleotide, and the fluorophore emits a detectable fluorescent signal. In another example of flow cells, the detected fluorescence is a result of chemiluminescence or bioluminescence. A designated reaction may also increase fluorescence (or Förster) resonance energy transfer (FRET), for example, by bringing a donor fluorophore in proximity to an acceptor fluorophore, decrease FRET by separating donor and acceptor fluorophores, increase fluorescence by separating a quencher from a fluorophore, or decrease fluorescence by co-locating a quencher and fluorophore.

As used herein, "electrically coupled" and "optically coupled" refers to a transfer of electrical energy and light waves, respectively, between any combination of a power source, an electrode, a conductive portion of a substrate, a droplet, a conductive trace, wire, waveguide, nanostructures, other circuit segment and the like. The terms electrically coupled and optically coupled may be utilized in connection with direct or indirect connections and may pass through various intermediaries, such as a fluid intermediary, an air gap and the like.

As used herein, a "reaction solution," "reaction component" or "reactant" includes any substance that may be used to obtain at least one designated reaction. For example, potential reaction components include reagents, enzymes, samples, other biomolecules, and buffer solutions, for example. The reaction components may be delivered to a reaction site in the flow cells disclosed herein in a solution and/or immobilized at a reaction site. The reaction components may interact directly or indirectly with another substance, such as an analyte-of-interest immobilized at a reaction site of the flow cell.

As used herein, the term "reaction site" is a localized region where at least one designated reaction may occur. A reaction site may include support surfaces of a reaction structure or substrate where a substance may be immobilized thereon. For example, a reaction site may include a surface of a reaction structure (which may be positioned in a channel of a flow cell) that has a reaction component thereon, such as a colony of nucleic acids thereon. In some flow cells, the nucleic acids in the colony have the same sequence, being for example, clonal copies of a single stranded or double stranded template. However, in some flow cells a reaction site may contain only a single nucleic acid molecule, for example, in a single stranded or double stranded form.

The term "active surface" is used herein to characterize a horizontal surface of a sensor or detector which operates as the sensor or detector within a package. For example, in examples where a CMOS sensor is utilized as a detector in the flow cell, the active surface is a portion of the surface of the CMOS sensor that includes nanowells. Throughout this disclosure, the terms die and wafer are also used in reference to certain examples herein, as a die can include a sensor and the die is fabricated from a wafer. The words wafer and substrate are also used interchangeably herein.

The term "fan-out" is used herein to characterize an area that is packaged with a detector that extends a horizontal distance beyond the detector. For example, in examples where a CMOS sensor is utilized as a detector in the flow cell, the fan-out refers to the additional horizontal distance on each side of the horizontal boundaries of the CMOS sensor.

As used herein, the term "pillar bump" and the term "bump" are both used to describe electrical contacts in examples illustrated and described herein. Wherever the terms "pillar bump" or "bump" are utilized, a variety of examples of electrical contacts can also be utilized in various examples of apparatuses illustrated herein. The electrical contacts, which may be pillar bumps or bumps, may comprise an electrically conductive material, such as a metal material (e.g., Cu (copper), Au (gold), W (tungsten), Al (aluminum) or a combination thereof), but it is understood that other electrically conductive materials may be utilized.

Reference is made below to the drawings, which are not drawn to scale for ease of understanding, wherein the same reference numbers are used throughout different figures to designate the same or similar components.

An element of various flow cells that contributes to the functionality of the flow cells is an ability to electrically connect to an active surface of a sensor or detector (e.g., CMOS) in the flow cell. Forming electrical connections (e.g., bond pads, contact pads) to the surface of a wafer in a flow cell itself is desirable to enable the flow cell to facilitate processes, such as SBS. For example, these electrical connections enable thermal transfer from the silicon wafer. Wire-bonding or otherwise electrically coupling to electrical contacts on the surface of the wafer, directly, is desirable from an efficiency and cost standpoint, but this direct connectivity is complicated by the ability of electrical contacts on a top surface of a wafer to maintain electrical integrity during the processing of the wafer that enables the wafer to facilitate SBS and other processes. There are at least two challenges to forming usable electrical contacts on the top surface of a wafer and various aspects described herein address at least these challenges. Generally speaking, existing methods and techniques utilized to form contacts may pose challenges to the functionality of: 1) the electrical connections on the surface of the wafer; and 2) the active surface of the wafer, including but not limited to, the nanowells. In reference to the first non-limiting example, certain processes that are utilized to prepare a wafer to perform SBS, such as a process of coating and polishing a wafer (a chemical coating is applied to the active surface and then, polished), can dramatically change the shape of the top-side contact pads and render wire-bonding to these pads from the topside impossible. In reference to the second non-limiting example, certain measures that could arguably enable greater accessibility to the contacts may be incompatible with the desired functionality of the sensor, for example, adding layers to electrical contacts (e.g., contact pads, bond pads, bump pads) on the topside of a sensor, can be corrosive to nanowells on the active surface of the wafer and without these nanowells being fully operational, SBS may be difficult, if at all possible, using the flow cell. The examples described herein address these challenges, as will be discussed herein in further detail.

One approach to the aforementioned challenges is rather than connect to electrical contacts directly at a topside of a sensor or detector in a flow cell, is to connect to these electrical contacts from the bottom side of a substrate, manufacturing flow cells in a manner that includes one or more through silicon vias (TSVs) extended through a portion of a silicon wafer and a passivation stack (e.g., the passivation stack is disposed below a lower surface of the portion of the silicon wafer, a portion of each of the one or more through silicon vias is exposed through an opening of one or more openings in the passivation stack, and each exposed portion is coupled to the electrical contacts). By forming electrical connections from the backside of the wafer, rather than the topside, the processing on the surface of the wafer need not comprise the electrical contacts. However, fabrication processes for flow cells that include the passivation layers and TSVs to allow bottom-side connectivity to the electrical contacts, are more complex and each portion of the process can potentially introduce issues into the manufacturing process and inconsistencies into the finished product. For at least this reason, it is desirable to fabricate or manufacture flow cells in such a manner that SBS and other processes are facilitated by sensors or detectors in the flow cells, but connectivity at the topside of the sensors or detectors can be accomplished.

As disclosed herein, various processes can be utilized to enable topside wire-bonding to sensors in flow cells. The processes described herein are compatible with existing fabrication approaches because they preserve at least some of these existing aspects, but in at least some examples add an additional coating (e.g., a metal coating) to topside contact pads, which are the electrical contacts on sensors or detectors in various flow cells. This additional coating can withstand certain treatments to the topside of the sensor region of the flow cell and also, enable wire-bonding to the topside of the sensor. As will be described in greater detail herein, in some examples of the processes, a metal layer (e.g., gold) can be added to using photolithography and masks regions outside of the contact pads on top of the sensors (e.g., CMOS sensors). The contact pads, in some examples, are aluminum wire-bonding pads. As will be explained in further detail herein, some examples of processes herein include a two mask process. Since the electroplating occurs only or substantially only where there is a seed layer (e.g., titanium tungsten (TiW)), this seed layer is patterned in order to minimize the edge effects of this bumping process around the (e.g., Aluminum (Al)) bond pad. Hence, a second mask is used to pattern the photoresist.

Various examples and illustrations herein describe examples of methods for forming bumps (e.g., metal bumps, including but not limited to gold (Au), platinum (Pt), copper (Cu), and/or nickel (Ni)) on a surface of one or more bonding pads. Forming these bumps allows the bonding pads (e.g., Al) to be accessible on an upper surface of a die, where the die is oriented on a substrate. The bonding pads are electrical contacts on the surface of the die, but are accessible electrically (e.g., for wirebonding) because of the bumps, so an area of the die which can be electrically connected to includes the bonding pads and the bumps. In order to couple electrical contacts elsewhere in a flow cell and/or outside of a flow cell to the bonding pads, one can couple these electrical contacts to the bonding pads, via the bumps. The coupling may include wire-bonding each electrical contact, which are not on the surface of the die, to one of the bonding pads (i.e., electrical contacts which are on the surface of the die) on the upper surface of the die, via the bumps, thereby forming wire-bonded connections.

Figure 2:
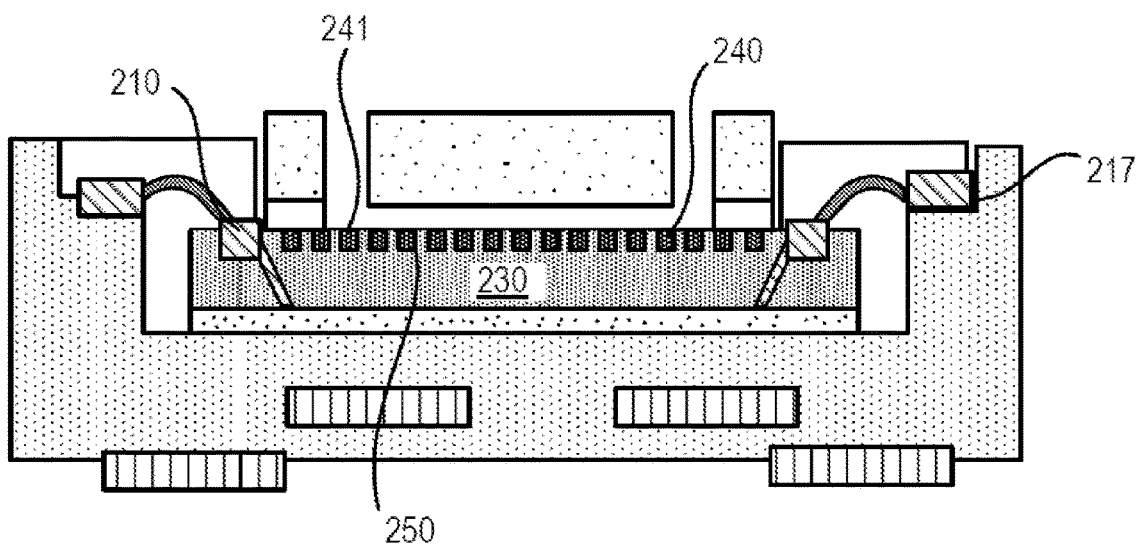

As explained above, various aspects of the examples described herein enable the fabrication and manufacturing of flow cells where electrical contacts (e.g., bond pads) are formed on an upper surface of a wafer, enabling wire bonding and/or other electrical connections to these contacts by electrical contacts elsewhere in a flow cell and/or outside of a flow cell. To that end, FIGS. 1-2 are illustrations of portions of various flow cells 100, 200, which illustrate electrical contacts formed on an active surface on a sensor or detector with connections to these electrical contacts at the topside of the wafer. In each of FIGS. 1 and 2, electrical contacts 110, 210 are provided on the active surface 140, 240 of a sensor or detector and these electrical contacts (e.g., bond pads) are wire bonded to additional electrical contacts 117, 217. The additional electrical contacts 117, 217 are electrical contacts elsewhere in a flow cell. A difference between these examples is that one includes a fan-out region, and the other does not. These figures are included to illustrate topside electrical coupling, which, as aforementioned, is enabled by examples disclosed herein. In each of these examples of flow cells 100, 200, the sensor or detector utilized in the flow cell is a CMOS. Detection devices and image sensors that can be utilized in flow cells as sensors (e.g., biosensors, including image sensors or detectors) include a CMOS and a fan-out region and those that do not include this region. In detectors with this fan-out region, a surface of the CMOS and the fan-out region (on either side) form an active surface. In flow cells that do not include this fan-out region, the active surface is the upper surface of the sensor or detector.

FIGS. 1-2 illustrate various aspects of flow cells 100, 200, both with (e.g., FIG. 1) and without (e.g., FIG. 2) this fan-out region. The flow cell 100 of FIG. 1 includes a fan-out region 140. In both FIG. 1 and FIG. 2, above the active surface of a CMOS (e.g., silicon wafer 130 in FIG. 1, silicon wafer 230 in FIG. 2) is a (micro)-fluidic flow channel 111, 211 delineated by a lid of the flow cell 100, 200 on one side, and either a contiguous surface including the active surface 120, 220 of a silicon wafer and portions of a fan-out region 142 on either side of this surface of the silicon wafer, or the top surface of the wafer itself. To perform processes such as the aforementioned SBS, electrical contacts 110, 210 are provided on the active surface 140, 240 of a sensor or detector. In both examples, these electrical contacts 110, 210, referred to as bond pads, are formed on a top surface of the silicon wafer die, and a wire bond 123, 223 connects the contacts 110, 210 to additional electrical contacts 117, 217. The active surfaces 140, 240 of both FIG. 1 and FIG. 2 include at least one nanowell 150, 250. In order to simplify the illustrations in FIGS. 1-2, certain aspects of the examples of flow cells depicted are not labeled, as the focus of these figures, for illustrative purposes, is on the topside electrical connectivity. As will be discussed herein, based on implementing various aspects described herein, this topside connectivity is enabled because the electrical integrity of the contacts on the active surface is preserved.

Figure 3A:
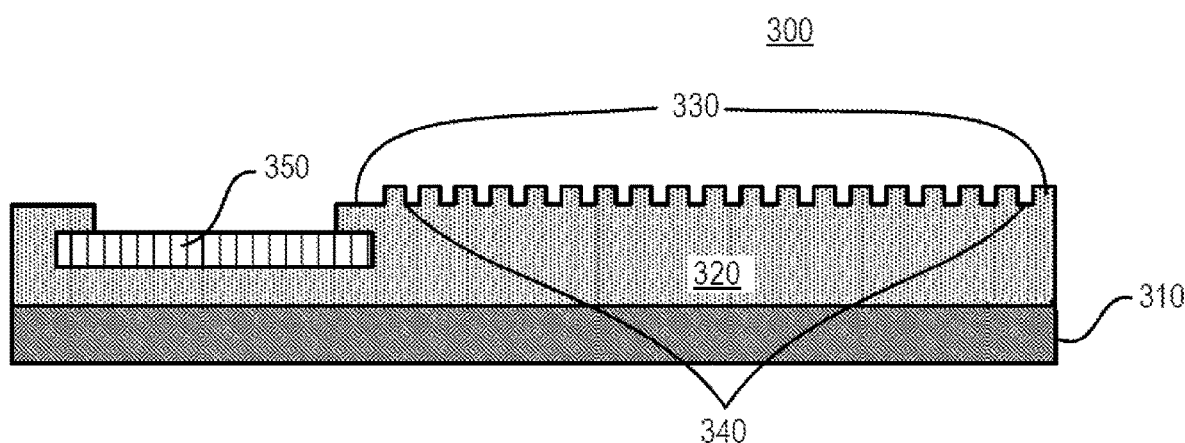
FIGS. 3A-3F depict an example of aspects of a method for implementing a protective layer on electrical contacts on a sensor such that topside bonding to the electrical contacts is enabled.
Figure 3B:
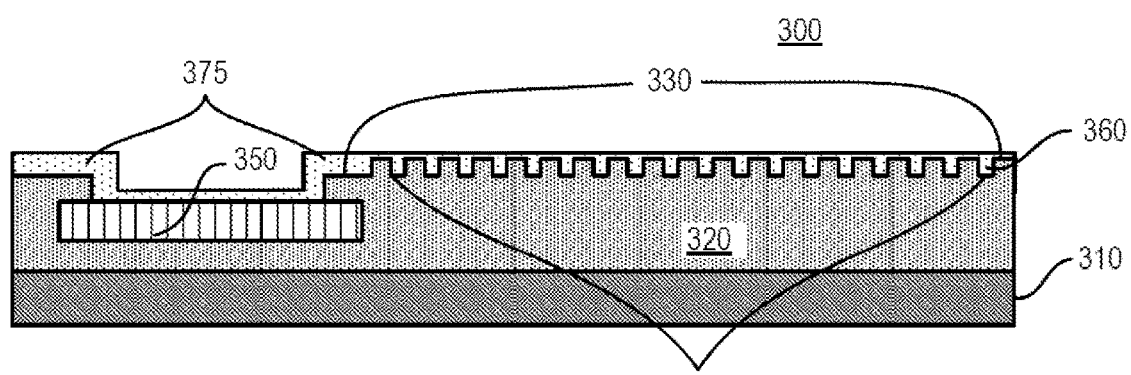

FIGS. 3A-3F depict various processes in an example of a workflow where topside electrical connectivity is provided on a sensor (e.g., a CMOS). FIGS. 3A-3F depict a portion of a flow cell 300 that includes a substrate 310, and a sensor 320 comprising an active surface 330 with nanowells 340. This portion of a flow cell 300 also includes an electrical contact 350 (e.g., a bond pad, contact pad, bump pad) on the topside of the sensor 320. Turning to FIG. 3A, in one example, the sensor 320 is prepared for use within the flow cell by removing a top oxide layer from the active surface 330, this can be accomplished using a RF cleaning etch to remove a layer of (e.g., Aluminum (Al)) oxide. As seen in FIG. 3B, a seed layer 360 is sputtered over the active surface 330 and the electrical contact 350. This sputtering of the seed layer 360 can be understood as a macro layer in that it is sputtered on the entirety of the top surface of the sensor 300. The seed layer can be comprised of materials, including but not limited to, titanium tungsten (TiW), copper (Cu), titanium copper (TiCu), and/or titanium (Ti).

Figure 3C:
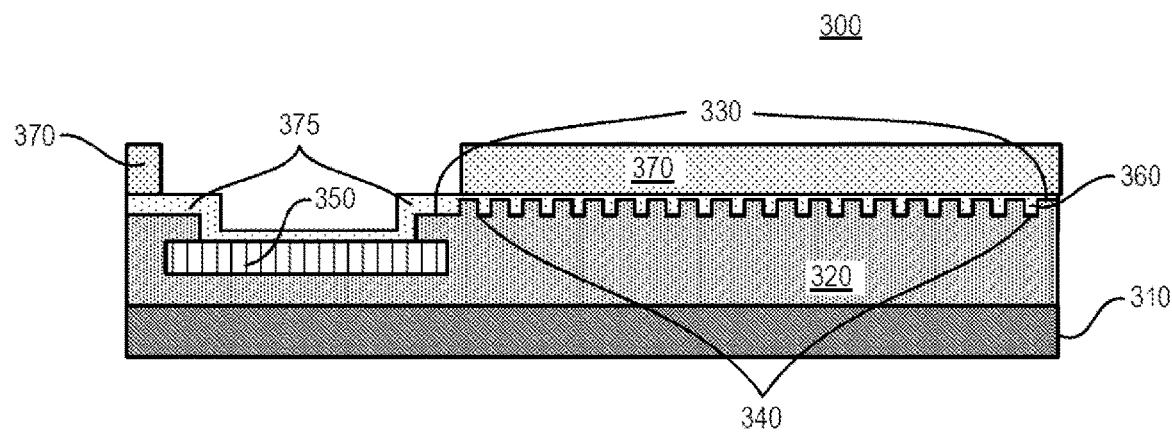

To protect the active surface 330 and preserve the nanowells 340 during further processing, as illustrated in FIG. 3C, photoresist 370 is patterned over the active surface 330. In this example, the photoresist 370 protects the nanowells during the formations of the protective layer 380 over the contact 350. This protective layer 380 may be electroplated. Portions of this protective layer 380 enable electrical connectivity to the contact, as explained herein. As discussed above, existing methods and techniques utilized to form contacts may pose challenges to the functionality of the active surface 330 of the wafer 320, including but not limited to, the nanowells.

Figure 3D:
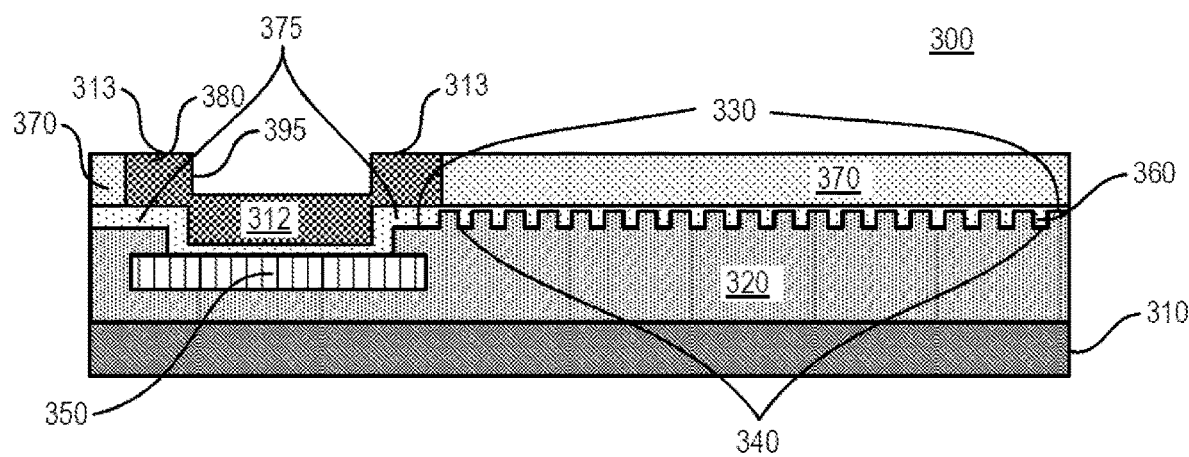
Figure 3E:
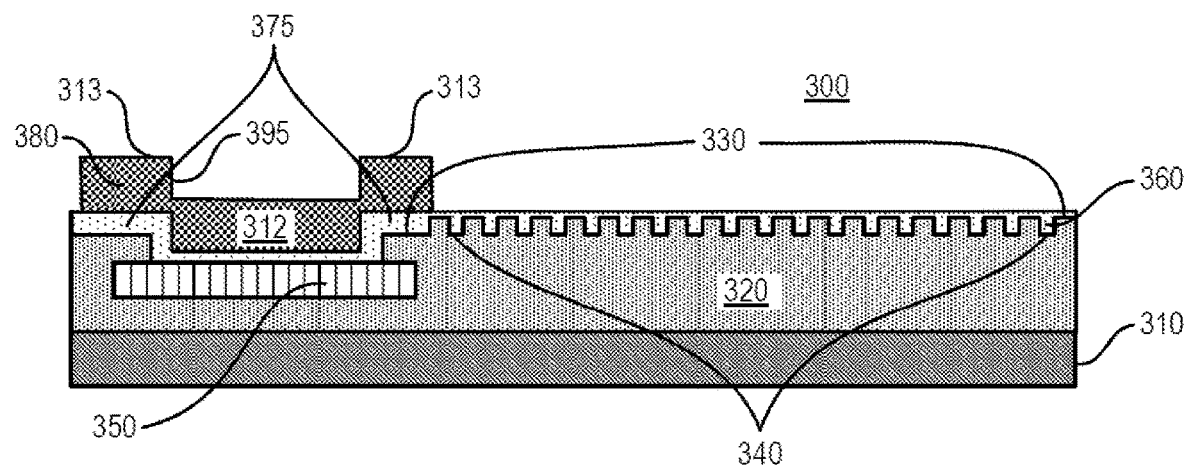
Figure 3F:
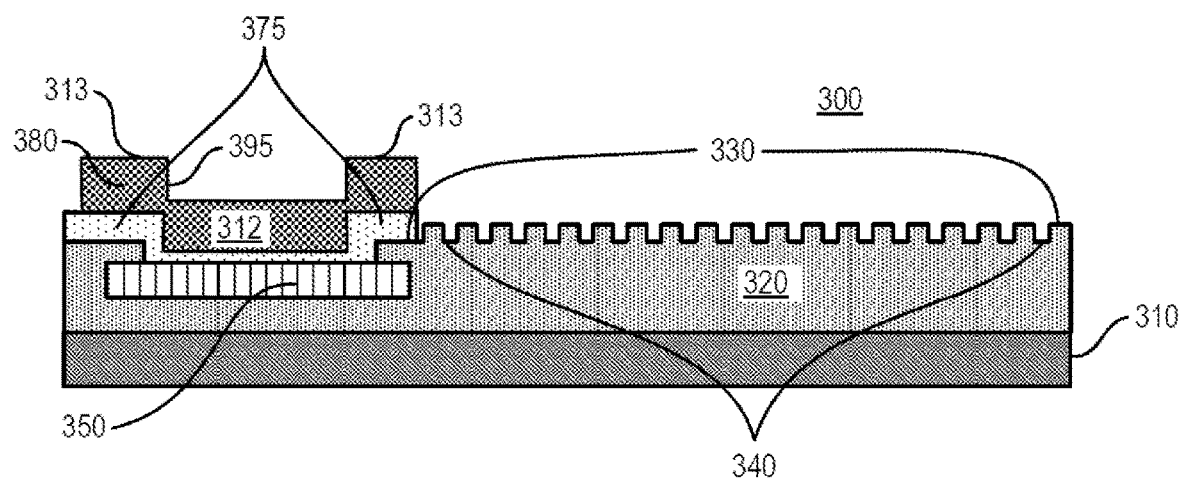

The photoresist 370 layer is patterned to create a window 375 that, in some examples, is wider than the electrical contact 350. As illustrated in FIG. 3D, a protective (metal) layer 380 is then electroplated over the seed layer 360 that is over the contact 350. The protective layer 380 can be comprised of materials including, but not limited to, gold (Au), platinum (Pt), copper (Cu), and nickel (Ni). After the electroplating is complete, the photoresist 370 can be removed from the active surface 330, as illustrated in FIG. 3E. Removing the photoresist 370 may include, but is not limited, using ultraviolet (UV) light to break down photoresist crosslinks and removing the photoresist by applying a developer to the die. In some examples of this process, the photoresist is not removed as the electroplating has already created bumps 395 (e.g., FIGS. 3D-3F) which can be utilized to wire bond the contact 350. However, as illustrated in this example, in FIGS. 3E-3F, both the photoresist 370 and a portion of the seed layer 360 are removed. As illustrated in FIG. 3F, the seed layer 360 is removed below the photoresist 370, but it remains between the protective layer 380 and the contact 350 because it seeds the formation of the protective layer 380 on the surface of the contact 350. This photoresist 370 layer, in addition to any photoresist layer mentioned herein, can be removed, for example, with a combination of ultra-violet (UV) light and a solvent referred to as a developer. For example, UV light is applied to break down the photoresist crosslinks and the photoresist is removed by swelling the photoresist by using a solvent (e.g., a developer). Meanwhile, the seed layer 360, for example, can be removed utilizing a wet etch (e.g., hydrogen peroxide).

Figure 4:
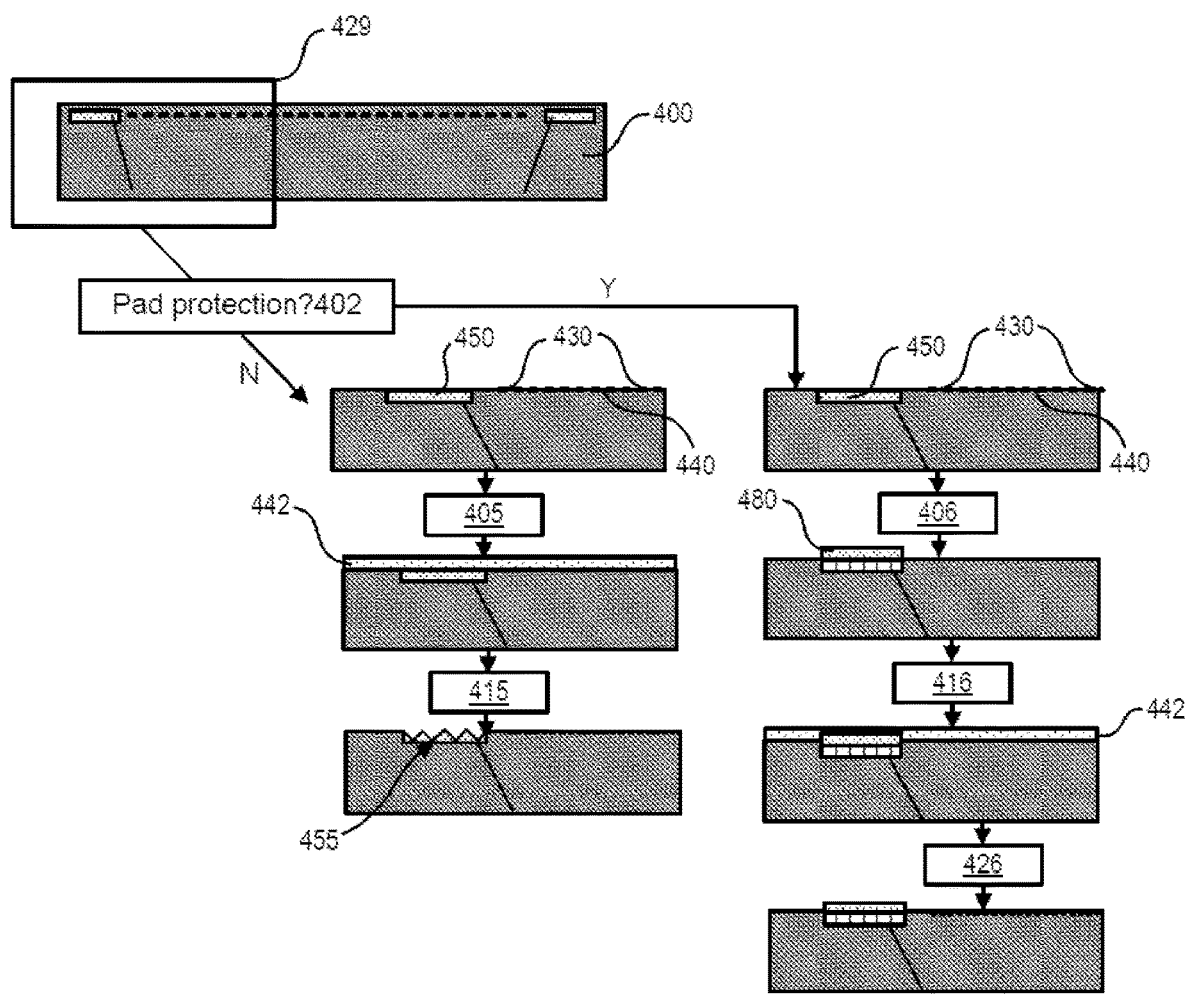
FIG. 4 illustrates an example of the effects of preparing a surface of a sensor for use in a flow cell on electrical contacts on the surface of the sensor in different workflow situations.

As discussed above, existing methods and techniques utilized to form contacts may pose challenges to the functionality of the electrical connections on the surface of the wafer. The electroplated bumps 395 mitigate this issue because they are resistant to further processes performed to prepare the active surface 330 of the sensor 320, as illustrated in FIG. 4. These bumps 395 can be perceived as a ledge, as the contact 350 is covered by the electroplated layer 312, but ledges 313 form in the outer portions of the window 375. Thus, the protective layer 380 formed over the region of the sensor 320 (wafer) with the electrical contact(s) 350 includes ledges 313 creating walls on the outer portions of the window 375 and a layer 312 over an inner portion of the window 375.

FIG. 4 illustrates a contrast between the durability of a sensor 400 in two different scenarios. In the scenario depicted on the left, the sensor is treated using the aforementioned coating and polishing, while in the scenario depicted on the right, a process, such as that depicted in FIGS. 3A-3F, is performed in the sensor such that the electrical contacts on the sensor include the electroplated layer (e.g., FIGS. 3D-3F, 380). FIG. 4 depicts two alternative workflows where a sensor 400 is protected with the electroplating of bumps, as depicted, for example, in FIGS. 3A-3F, and where this protection is not provided to the sensor 400. A portion 429 of the sensor 400 is utilized in FIG. 4 to highlight the workflows. As discussed above, aspects discussed herein serve to preserve the functionality of the sensor while forming topside contacts.

As aforementioned, the workflow on the left of FIG. 4 demonstrates how certain aspects of existing flow cell fabrication processes may impact the electrical integrity of a contact on the topside of a wafer. Hence, turning first to the workflow illustrated on the left, without electrical contact (pad) protection (402), the sensor 400 with at least one topside contact 450 and an active surface 430 is coated. In some examples, certain portion(s) of the die or sensor structure are coated with a polymeric material 442. The polymeric material may be, for example, a gel-based material, such as a polyacrylamide gel coating, including, for example, poly(N-(5-azidoacetamidylpentyl) acrylamide-co-acrylamide-co-acrylonitrile) ("PAZAM"). In one example, the die or sensor structure 429 includes at least one nanowell 440 at the surface (active surface 430), and the coating is present at the bottom and/or sidewall portions of the nanowell 440. During the coating process (405), the coating is applied over the electrical contact 450. After the coating is applied (405), at least a portion of the coating is polished (415). As illustrated in FIG. 4, the coating (405) and subsequent polishing (415) may result in damage 455 to the electrical contact 450. As the electrical contact can be made from aluminum, the damage can be aluminum damage. This damage can render the electrical contacts unusable when accessed from the topside of the sensor 400.

As aforementioned, the workflow on the right illustrates how various aspects of examples illustrated and disclosed herein serve to preserve the electrical integrity of contacts formed on the topside of a wafer. Thus, turning now to the workflow on the right, with the electrical contact (pad) protection (402), as illustrated, for example, in FIGS. 3A-3F, and also discussed in certain other variations herein, the sensor 400 (including the portion of the sensor 429) with at least one topside contact 450 and an active surface 430 is protected with an electroplated metal layer 480 (e.g., gold (Au), platinum (Pt), copper (Cu), and/or nickel (Ni)) (406). Although not pictured, the metal layer 480 includes the aforementioned bumps, which can be utilized in wire bonding to the electrical contact(s) 450 via the topside of the sensor 400. As depicted in FIG. 4, in some examples, certain portion(s) of the die or sensor structure are coated with a polymeric material 442 (416). As stated above, the polymeric material may be, for example, a gel-based material, such as a polyacrylamide gel coating, including, for example, poly(N-(5-azidoacetamidylpentyl) acrylamide-co-acrylamide-co-acrylonitrile) ("PAZAM"). In this example, the die or sensor structure 429 includes at least one nanowell 440 at the surface (active surface 430), and the coating is present at the bottom and/or sidewall portions of the nanowell 440. During the coating process (416), the coating is applied over the electrical contact 450, above the protective layer 480 on the electrical contact 450. After the coating is applied (416), at least a portion of the coating is polished (426). Because the electrical contact 450 has a protective layer 480, damage to the contact 450 is either minimized and/or prevented such that the topside wire bonding to the sensor 400 is enabled, via the protective layer 480 (which is conductive). One of skill in the art will appreciate that various aspects from some examples in this disclosure, such as, referencing elements of FIGS. 3A-3F for illustrative purposes only and not to impose any limitations, the addition of the seed layer 360 and the photoresist 370, mitigate damage that may occur to various portions of the wafer during processing. These additional protective aspects, which are discussed in some examples, are omitted in FIG. 4 for illustrative purposes.

Figure 5:
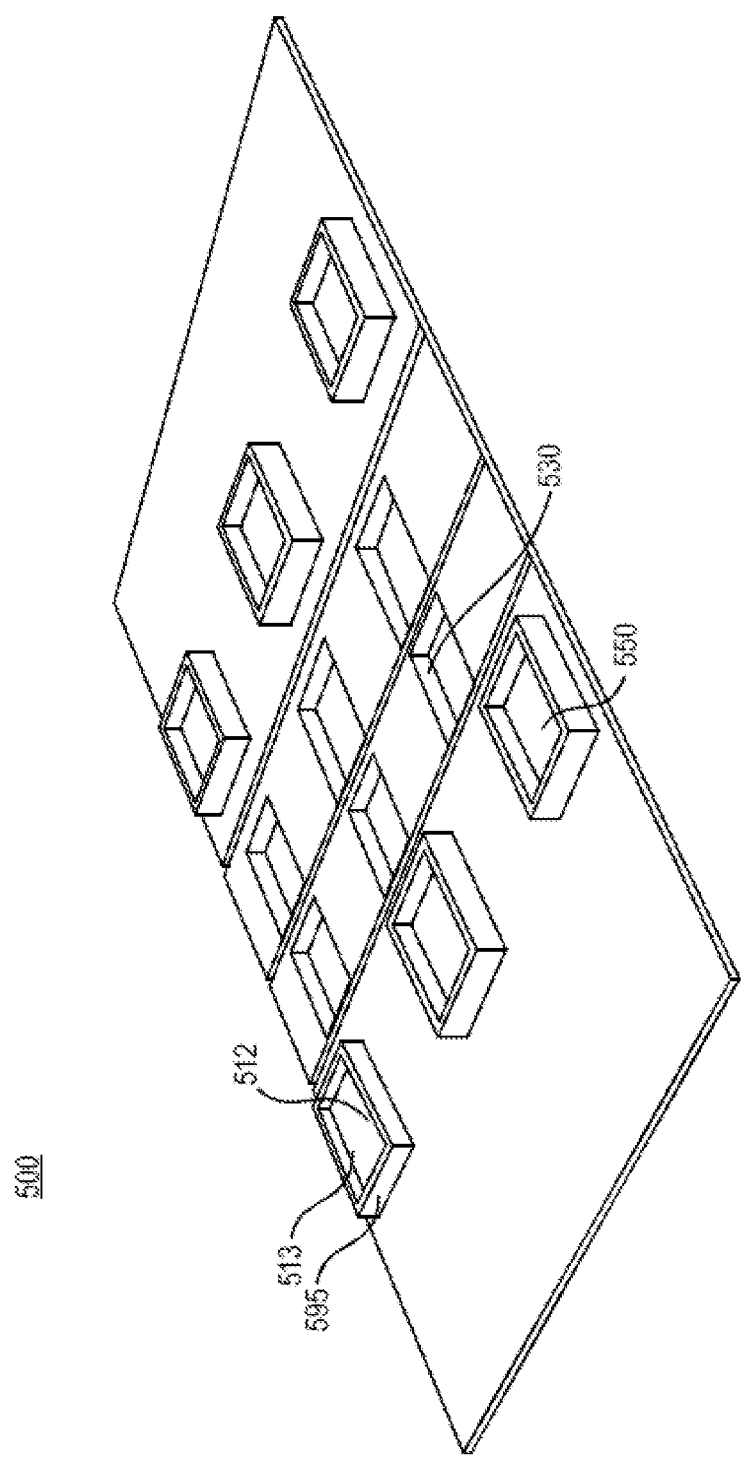
FIG. 5 is an example of a sensor with a protective layer.

As previously illustrated in FIGS. 3D-3F, the protective layer 380 over the region of the sensor 320 (wafer) with the electrical contact(s) 350 includes ledges 313 creating walls on the outer portions of the window 375 and a layer 312 over an inner portion of the window 375. These aspects are illustrated with FIG. 5, which is a profile view of a sensor (e.g., a CMOS) 500 with electrical contacts 550, in this example, protective layer electroplated layer 512 and ledges 513 formed, forming bumps 595 (e.g., gold (Au), platinum (Pt), copper (Cu), and/or nickel (Ni)), on an electrical contact 550 (e.g., bump pad) on a wafer (sensor 500). FIG. 5 depicts similar structure to FIG. 3F, but from a different perspective, a three dimensional profile, so that the wafer topography is more visible. FIG. 5 illustrates electrical contacts 550 (e.g., bump pads) with and electroplated layer 512 and ledges 513 formed, creating a wall structure surrounding the electrical contact 550. The electrical contacts 550, in this example, are plated with gold (Au), and the active surface 530 of the sensor 500, which includes nanowells (not visible in this figure), is not plated with the protective layer 580. If an electroplated protective layer (e.g., FIGS. 3D-3F, 380) were plated on the active surface 530, the resulting damage to the active surface 530 would render the sensor unsuitable for imaging, flow cells, etc. This issue is illustrated in FIG. 6.

Figure 6:
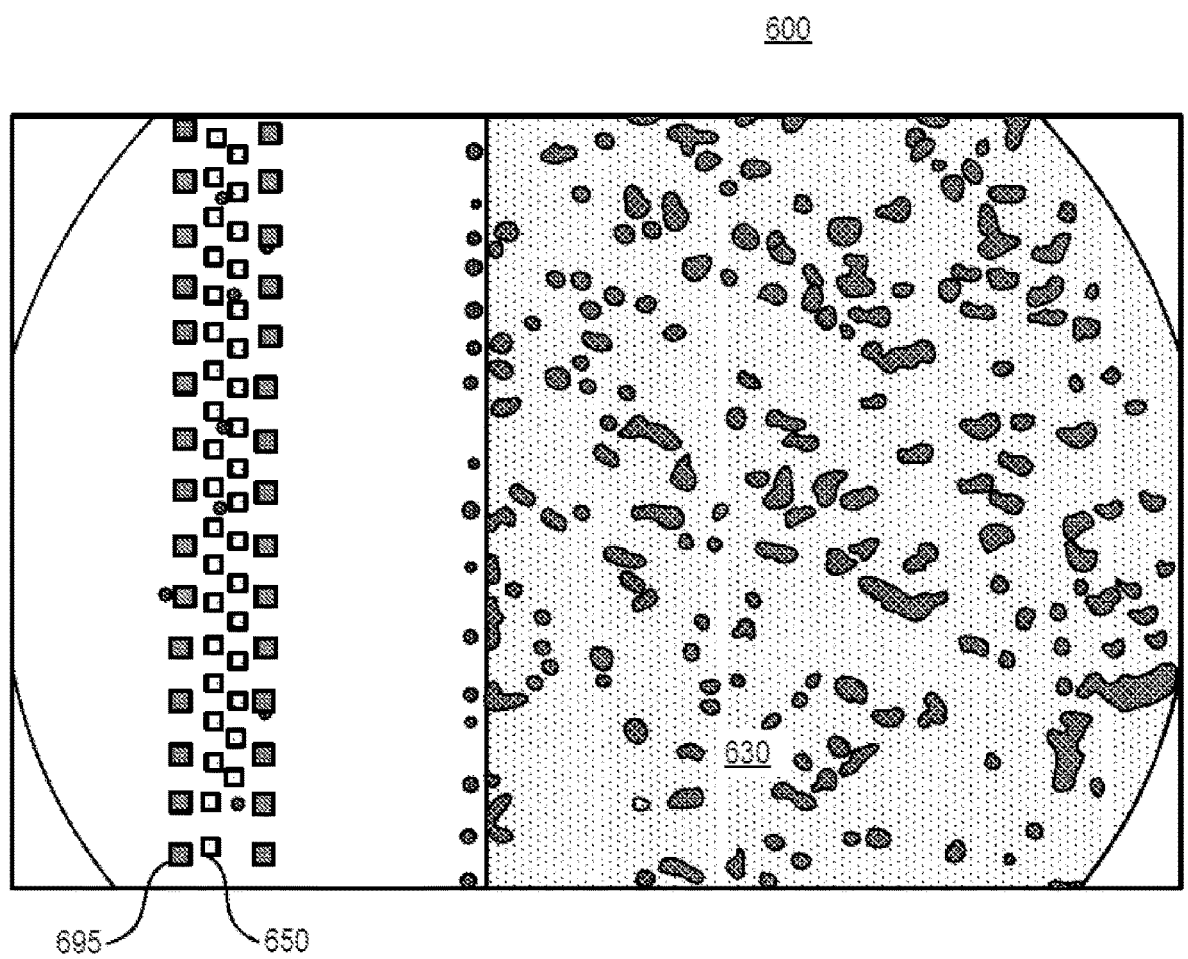
FIG. 6 is an example of damage to a sensor when certain portions of processes disclosed herein are not implemented.

FIG. 6 provides a view of an active surface 630 of a sensor 600 which has been damaged with depositing the material utilized to provide protection and contact points to the electrical contacts 650 on the topside surface of the sensor 600. In this example, gold (Au) is the material utilized for the coating. The depositing of this material on the active surfaces 630 of the wafer comprising the sensor 600 compromises the functionality of the sensor. The bumps 695 created in the electroplating process, providing connectivity to the electrical contacts 650, are also visible in this figure.

As aforementioned, FIGS. 3A-3F illustrate some examples of a process for adding a protective layer to electrical contacts that both preserves the contacts during preparation of the active surface of the wafer (sensor or detector), but also, enables topside electrical connectivity to the wafer. FIGS. 7A-7E and FIGS. 8A-8E illustrate other examples of methods and processes for enabling topside bonding to a wafer based on implementing metal bumps on the electrical contacts. As with the process illustrated in FIGS. 3A-3F, the processes illustrated in FIGS. 7A-7E and FIGS. 8A-8E provide benefits that may maintain the functionality of a wafer (when utilized, e.g., in a flow cell), which include, but are not limited to: 1) preserving functionality of the electrical connections on the surface of the wafer; and 2) preserving functionality the active surface of the wafer, including but not limited to, the nanowells. As aforementioned, certain existing manufacturing and fabrication processes can pose challenges to forming electrical contact on a topside of a wafer.

Figure 7A:
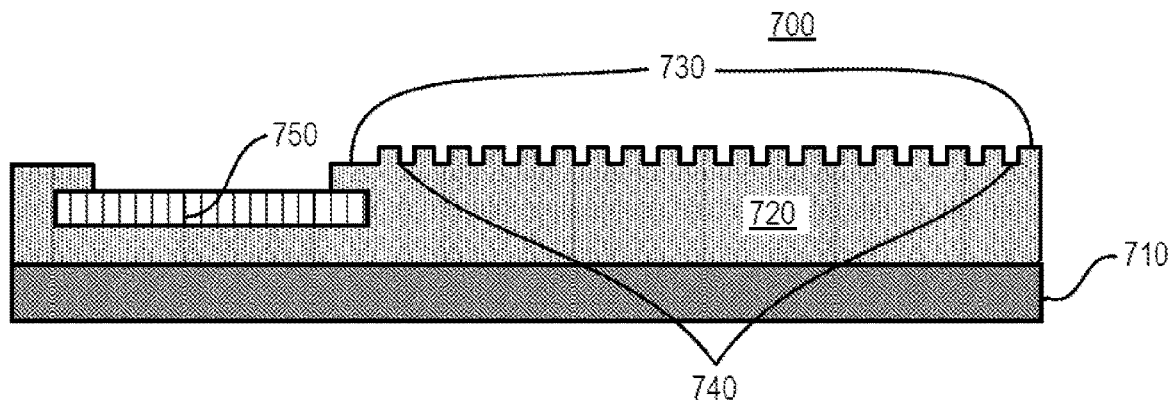
FIGS. 7A-7E depict an example of aspects of a method for implementing a protective layer on electrical contacts on a sensor such that topside bonding to the electrical contacts is enabled.
Figure 7B:
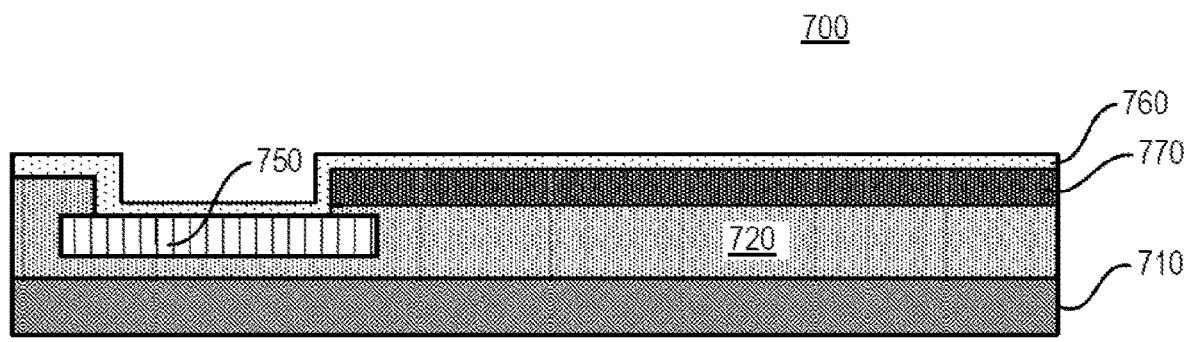

A difference between FIGS. 3A-3F and FIGS. 7A-7E is placement of a seed layer 360, 760, and placement as well as a number of photoresist layer(s) 370, 770, 772. But as explained herein, despite these structural variations, which are included to illustrate flexibility in fabrication of contacts on a topside of a wafer and not to introduce any limitations, these aspects, in both examples, serve to protect both the contacts as well as the active surface, during the fabrication or manufacturing of a wafer (e.g., for utilization in a flow cell). Referring to FIGS. 7A-7E, a portion of a sensor 700 (e.g., a CMOS) is depicted which includes an electrical contact 750 and an active surface 730, with at least one nanowell 740. In this example, the sensor 700 is oxidized (e.g., oxide cleaned) and then a photoresist 770 is applied and patterned over the active surface 730 of the sensor 700, as opposed to over a seed layer, as is done in FIGS. 3A-3F. A seed layer 760 (e.g., titanium tungsten (TiW), copper (Cu), titanium copper (TiCu), and/or titanium (Ti)) is formed over a surface of the sensor 700, which includes the photoresist 770 and the electrical contact 750, as illustrated in FIG. 7B. In another example, rather than oxidize the sensor 700 in advance of the photoresist 770, the photoresist 770 and seed layer 760 are formed and the sensor is oxidized, meaning the metal comprising the electrical contact 750, which can be aluminum (Al), is oxidized.

As previously noted, in contrast to the example illustrated in FIGS. 3A-3F, in FIGS. 7A-7E, the photoresist 770 is below the seed layer 760, as opposed to FIGS. 3A-3F, where the seed layer 360 is below the photoresist 370. This difference in a process for forming contacts on a topside of a wafer may serve to protect the active surface of the wafer during processing. For example, in some situations, based on a material utilized in the photoresist 370, 770 and/or the seed layer 360, 760, it may be challenging to remove these layers, as illustrated in FIG. 3. To overcome any material compatibility issues, as illustrated in FIG. 7B, the photoresist 770 is implemented at approximately the same time as the seed layer 760, when the photoresist is patterned, and before the application of a second photoresist layer 772. The seed layer 760 becomes a highway for an electrical signal even though the seed layer 760 does not touch the active surface 730 of the sensor 700 (in contrast to the seed layer 360 in FIG. 3A, which is formed on the active surface 330). A similar configuration is discussed later, in FIG. 8B, where these highways for electrical signals are also formed through a seed layer 860. Despite these non-limiting variations in configurations, the implementation of at least one photoresist layer above an active surface of a sensor helps to preserve functionality the active surface of the wafer, including but not limited to, the nanowells.

Figure 7C:
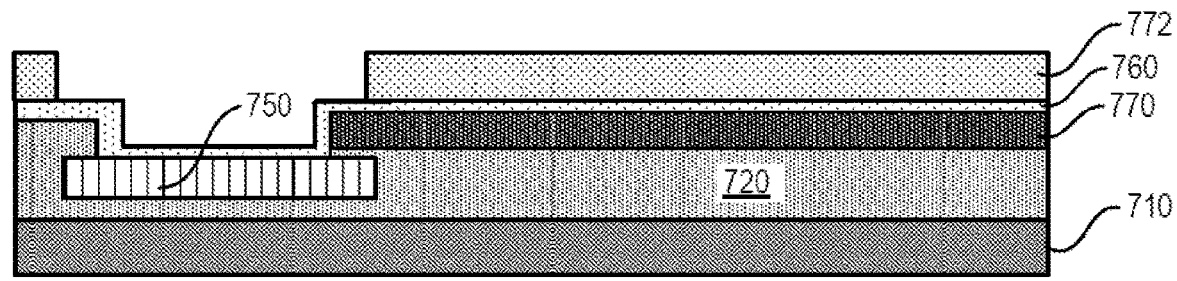
Figure 7D:
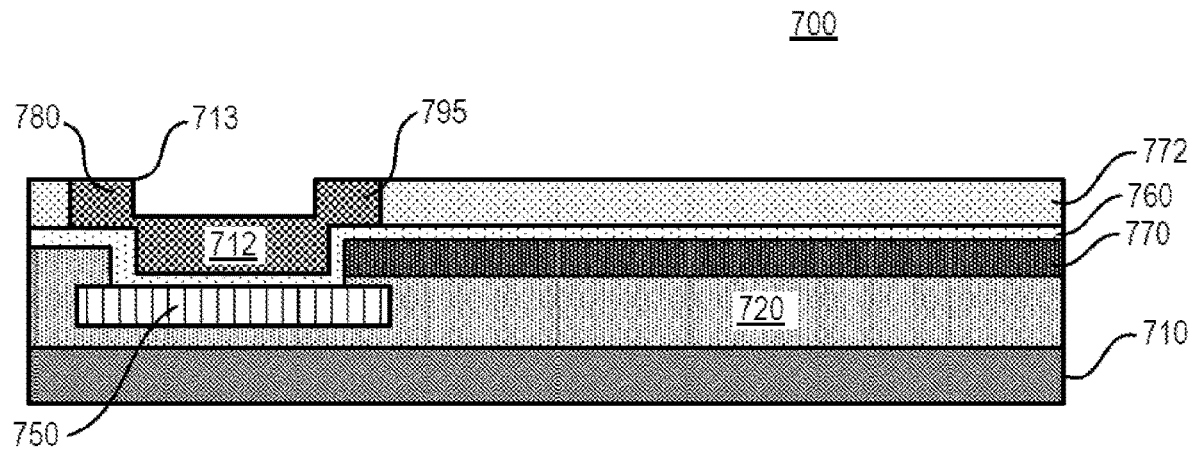
Figure 7E:
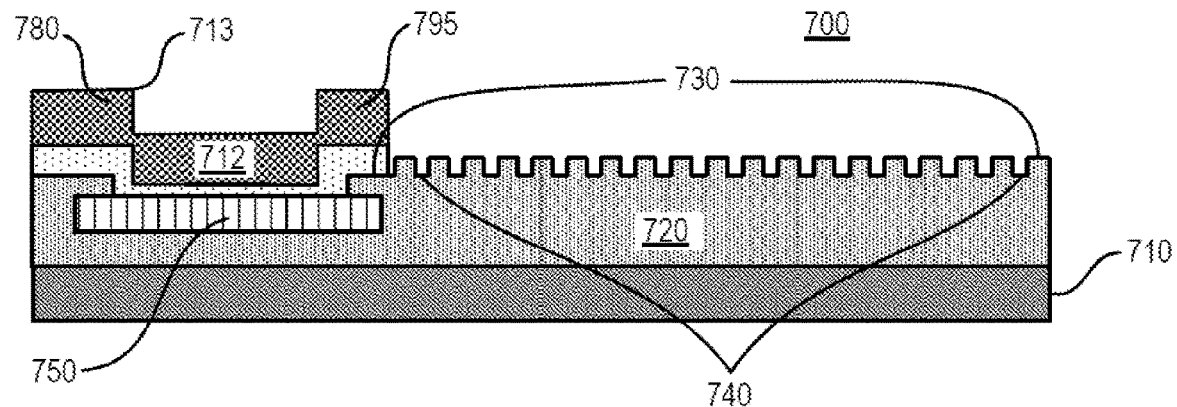

Turning to FIG. 7C, as noted above, a second photoresist layer 772 is formed over the seed layer 760, and this second photoresist layer 772 is patterned. FIG. 7D illustrates electroplating the protective layer 780, (e.g., gold (Au), platinum (Pt), copper (Cu), and/or nickel (Ni)) including bumps 795, and a layer 712 over the contact 750. The protective layer 780 can be comprised of materials including, but not limited to, gold (Au), platinum (Pt), copper (Cu), and nickel (Ni). After the electroplating is complete, in this example, the second photoresist 772, is removed, as illustrated in FIG. 7E, as is the portion of seed layer 760 that is above the active surface 730, and the other photoresist layer 770. As aforementioned, photoresist may be removed using approaches including, but is not limited, using ultraviolet (UV) light to break down photoresist crosslinks and removing the photoresist by applying a developer to the die. The portion of the seed layer 760 above the contact 750 seeds the connection of the protective layer 780 to the contact 750. In some examples, portion of the seed layer 760 that is removed, is removed utilizing a wet etch (e.g., hydrogen peroxide). The remaining structure, after the removal of part of all of certain layers, as illustrated in FIG. 7E, is a sensor 700 which can be coated and polished and then, a wire bond can be formed from the electrical contact 750, to an electrical contact outside of the flow cell and/or in another location in the flow cell. The protective (conductive) layer 780 enables the wire bonding to the contact 750. As in the example illustrated in FIGS. 3A-3F, in FIG. 7E, the protective layer 780, which is seeded to the contact 750 with a seed layer 760, preserves functionality of the electrical connections on the surface of the wafer. In FIGS. 7A-7D, the seed layer 760 can be understood as a macro photoresist layer 770, which is patterned over an entirety of the active surface 330 and the electrical contact 750, while the second photoresist layer 772, can be understood as a micro layer, in that it is patterned around the electrical contact(s) 750 (e.g., the bond pad(s)).

Figure 8A:
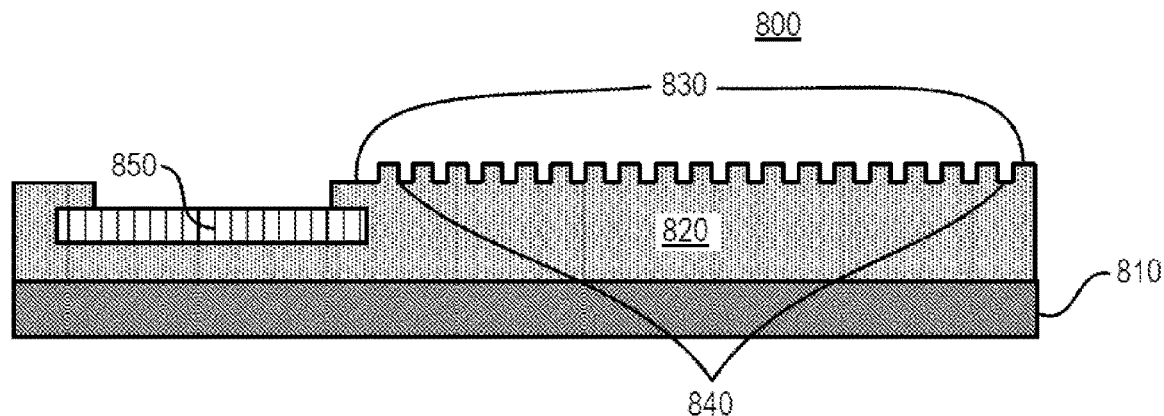
FIGS. 8A-8E depict an example of aspects of a method for implementing a protective layer on electrical contacts on a sensor such that topside bonding to the electrical contacts is enabled.
Figure 8B:
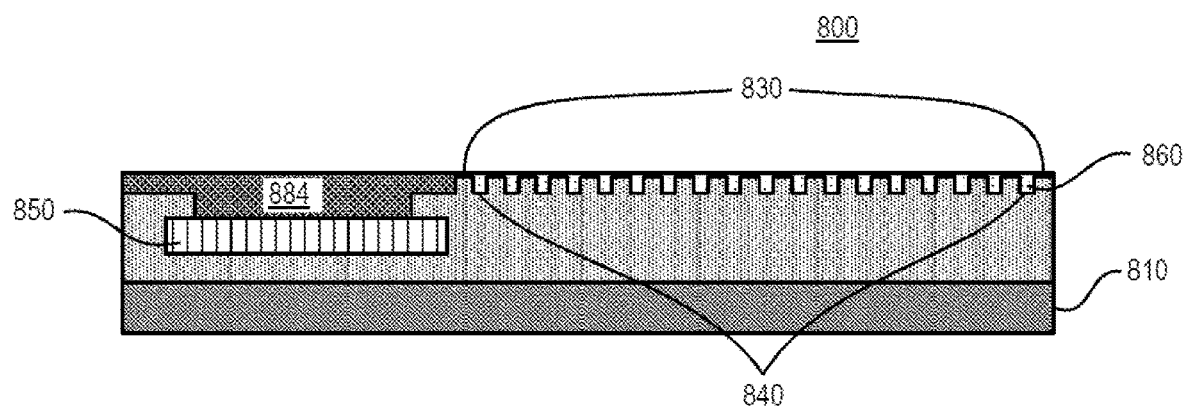
Figure 8C:
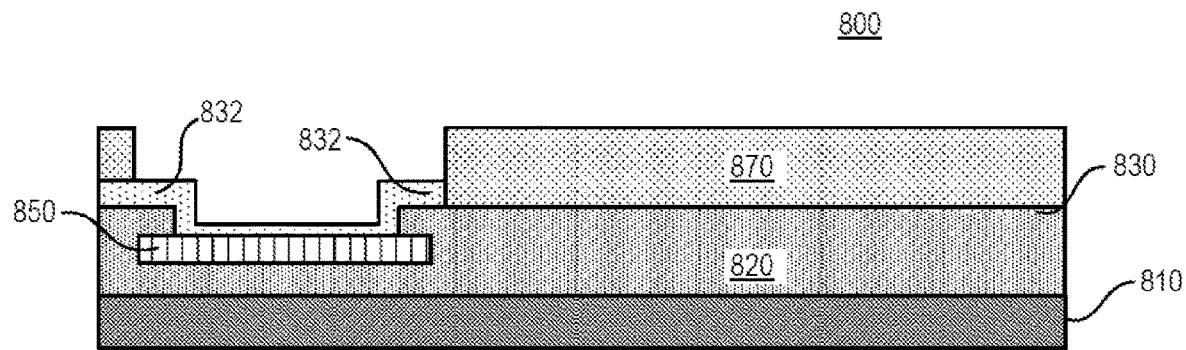

As with the examples illustrated in FIGS. 3A-3F, and FIGS. 7A-7E, aspects of the examples illustrated in FIGS. 8A-8E likewise preserve functionality of the electrical connections on the surface of the wafer; and 2) preserving functionality the active surface of the wafer, including but not limited to, the nanowells. Referring to FIGS. 8A-8E, a portion of a sensor 800 (e.g., a CMOS) is depicted. In FIG. 8A, the portion of the sensor 800 includes an electrical contact 850 and an active surface 830, with at least one nanowell 840. Moving from FIG. 8A to FIG. 8B, not only is the sensor 800 oxidized (e.g., oxide cleaned) and a seed layer 860 (e.g., titanium tungsten (TiW), copper (Cu), titanium copper (TiCu), and/or titanium (Ti)) formed as a macro layer over the sensor, including the active surface 830 and the electrical contact(s) 850 (e.g., bond pads), but also, as illustrated in FIG. 8B, first photoresist layer 884 is applied and patterned over the electrical contact 850. In this example, a portion of the seed layer 860 that is not under the photoresist 884 is stripped. Then, the (protective) photoresist 884 is stripped so that, as seen in FIG. 8C, seed layer 860 remains over the contact(s) 850 (e.g., the bond pad) since the photoresist 884 minimized and/or prevented its removal. In contrast to the examples illustrated in FIGS. 3A-3F and FIGS. 7A-7E, in this example, illustrated in FIGS. 8B-8D, the portion of the seed layer 860 over the active surface 830 is removed (e.g., FIGS. 8B-8C) before the protective layer 880 is added (e.g., FIG. 8D). This protective layer 880 may be electroplated. After the portion of the seed layer 860 over the active surface 830 is removed, the portions of the seed layer 860 that remain, as illustrated in FIG. 8C, will become (connectivity) highways 832 of the metal protective layer 880 (e.g., gold (Au), platinum (Pt), copper (Cu), and/or nickel (Ni)) (e.g., FIG. 8E, 832). In some examples, the seed layer 860 over the active surface 830 may or may not be removed using an etchant that preserves the nanowells 840.

Returning to FIG. 8B, the first photoresist layer 884, which is applied over the contact 850 and portion of the seed layer 860 above the contact, may assist in preserving this portion of the seed layer 860 so it can be utilized, for example, as a connectivity highway 832 to the seed metal protective layer 880 (e.g., FIG. 8D), which will include the bumps that enable electrical coupling to the topside of the sensor 800. This aspect assists in maintaining the functionality of the electrical connections on the surface of the wafer.

Figure 8D:
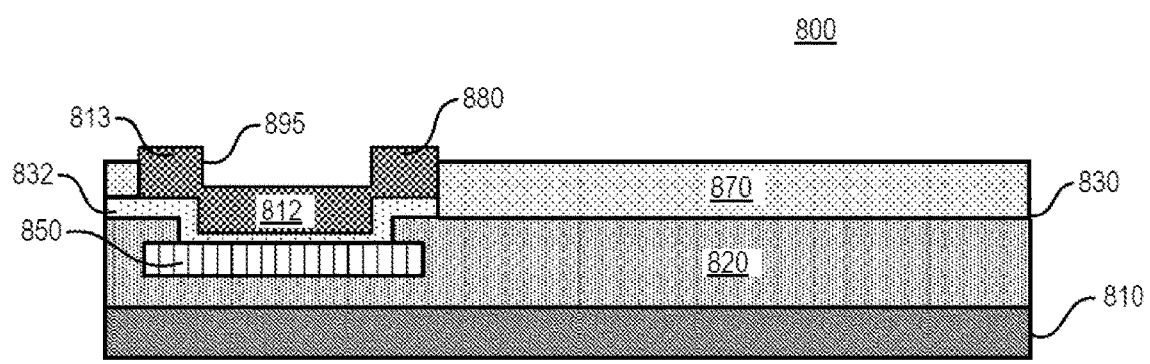
Figure 8E:
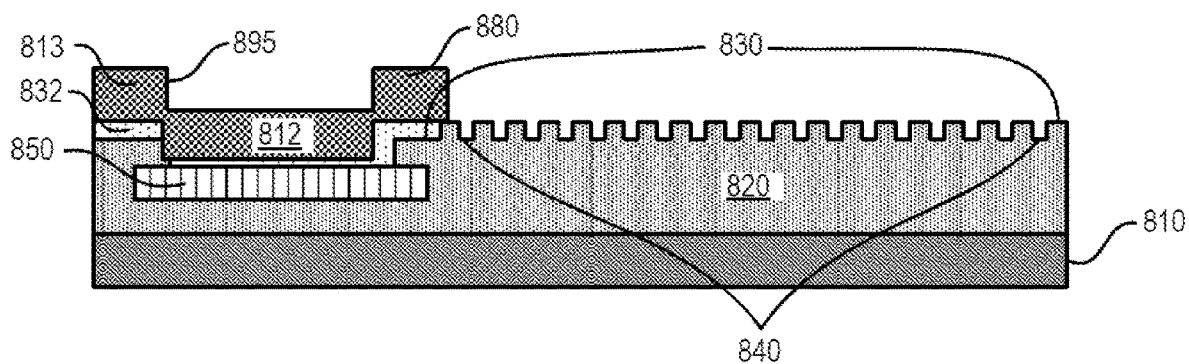

Referring to FIG. 8C, maintaining functionality of the nanowells 840 on the active surface 830 is also addressed by certain aspects of this example. As also illustrated in FIG. 8C, a second photoresist layer 870 is formed over the active surface 830 of the sensor 800. This second photoresist layer 870 is patterned (developed), in advance of electroplating the sensor 800, as seen in FIG. 8D, to add a metal protective layer 880, which will include the bumps that enable electrical coupling to the topside of the sensor 800. The more elevated portions of the electroplated layer 880 are visible in FIG. 8E, and FIG. 8E depicts a ledge 813 that is formed, which is also illustrated in FIG. 5 (e.g., FIG. 5, 513). As illustrated by FIGS. 8D-8E, the photoresist 870 is stripped. The photoresist layer can be removed using methods that include, but are not limited to, using ultraviolet (UV) light to break down photoresist crosslinks and removing the photoresist by applying a developer to the die. In some examples, any portions of the seed layer 860 that remain after the initial removal of the layer and are not covered by the bumps of the metal protective layer 880, are removed. For example, if there is any portion of the seed layer 860 that remains that overhangs the bumps, it is removed.

Figure 9:
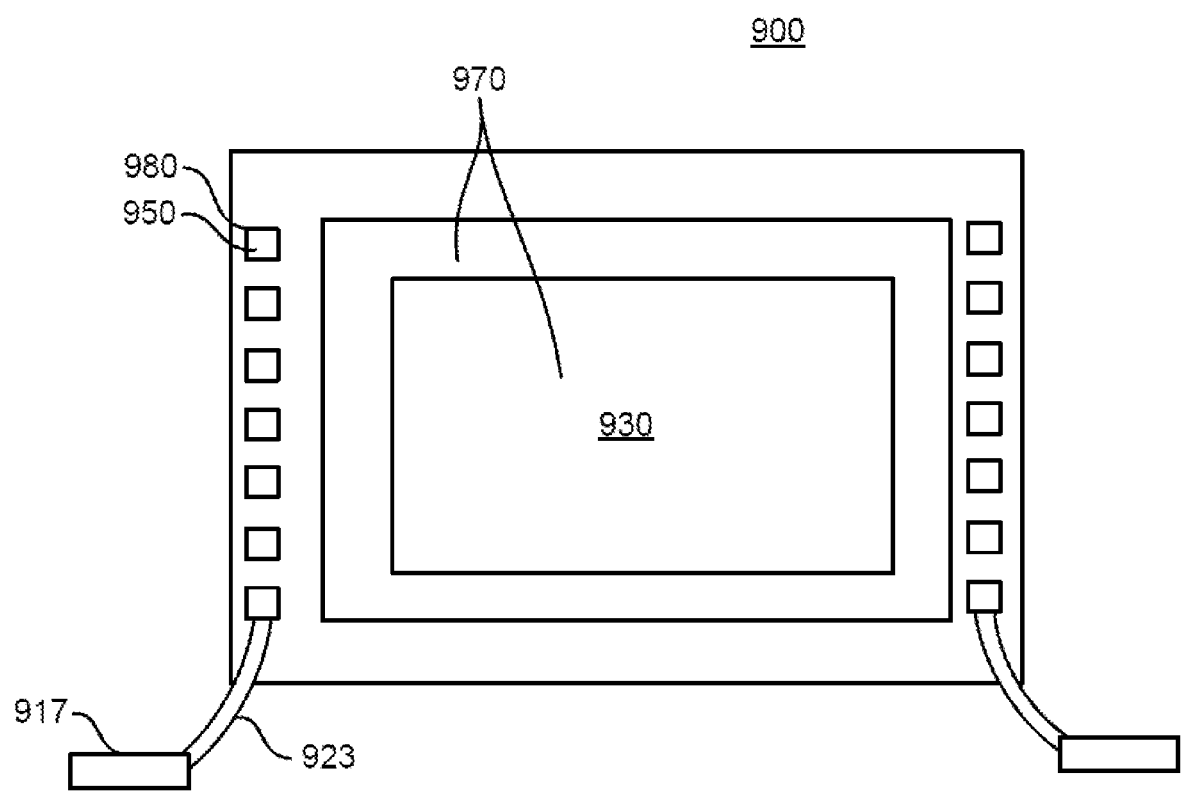
FIG. 9 illustrates an example of aspects of a method for implementing a protective layer on electrical contacts on a sensor such that topside bonding to the electrical contacts is enabled.

FIG. 9 also illustrates various examples of various aspects in methods and processes disclosed herein, but an illustration of a portion of a sensor 900 is provided from a different vantage point or perspective to illustrate the placement of various layers, in accordance with certain examples. As with the earlier examples, in FIG. 9, aspects of the example result in a wafer to which topside connectivity is possible and the in the process of forming the contacts, the functionality of the active surface is preserved. In this example, photoresist 970 is formed over an area of the sensor 900 that includes the active surface 930, but the photoresist 970 is not formed over the electrical contacts 950 (e.g., bond pads). The photoresist 970 is patterned. The photoresist 970, in part, serves to maintain the active surface during further aspects. A seed layer (not visible from the perspective of FIG. 9) (e.g., titanium tungsten (TiW), copper (Cu), titanium copper (TiCu), and/or titanium (Ti)) is then sputtered over the sensor 900 and seeds the portions of the sensor 900 that are not covered by the photoresist 970 for application of the electroplated protective layer 980, which includes bumps, i.e., the aforementioned ledges (not visible from this perspective). Before this protective later 980 is applied, in this example, a second photoresist layer, which creates pathways between the electrical contacts, is applied and patterned. This additional layer is not depicted in FIG. 9. With the photoresist proximate to the electrical contacts 950 patterned, the sensor 900 is electroplated and the protective layer 980 is formed. After the electroplating is complete, the seed layer 960 can be removed in locations where the protective layer 980 is not covering it. As illustrated in FIG. 9, electrical contacts 950 are wire-bonded 923 to additional contacts 917, via the protective layer 980 Then, as explained in the discussion of FIG. 4, the sensor is coated and polished so it can be utilized in various apparatuses, including but not limited to, a flow cell.

Figure 10:
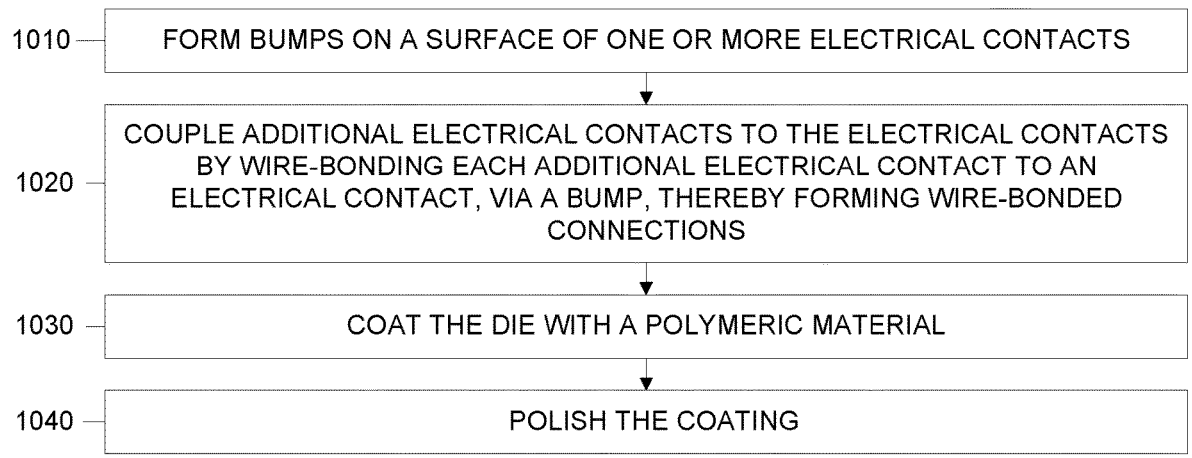
FIG. 10 is a workflow that illustrates aspects of one or more examples of forming topside electrical contacts on a die.
Figure 11:
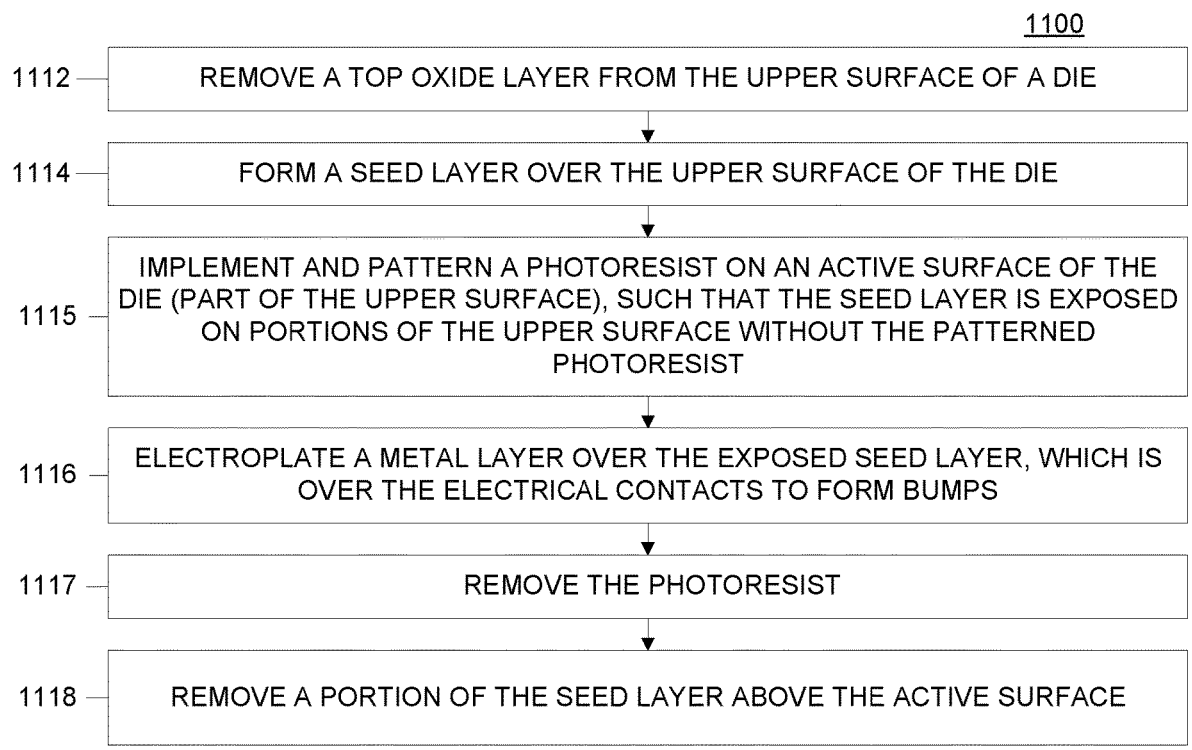
FIG. 11 is a workflow that provides more granular detail of certain aspects of the workflow of FIG. 10.

FIGS. 10 and 11 are workflows that illustrate examples of methods for fabricating and/or manufacturing sensors with topside electrical contacts. For ease of understanding and not to suggest any limitations, reference is made throughout the descriptions of these examples, to various aspects some of FIGS. 3A-3F, 7A-7E, and 8A-8E. Thus, some examples of elements of the workflows can be visualized more easily.

Referring first to FIG. 10, in this example workflow 1000, bumps are formed on a surface of one or more electrical contacts (1010). The bumps may be made of various materials, including but not limited to, gold (Au), platinum (Pt), copper (Cu), and/or nickel (Ni). These electrical contacts (e.g., 350, 750, 850) are accessible on an upper surface of a die (e.g., a CMOS) (e.g., 300, 700, 800), where the die is oriented on a substrate. The electrical contacts may be (e.g., Al) bonding pads. These electrical contacts (e.g., 350, 750, 850), which may or may not be bonding pads, include but not limited to, die bonding pads, and in some examples, are adjacent to an active surface (e.g., 330, 730, 830) of the die. The active surface includes nanowells (e.g., 340, 740, 840). The nanowells may or may not form a nanowell array.

Additional electrical contacts (e.g., substrate bonding pads) are coupled to the one or more electrical contacts by wire-bonding each additional electrical contact to one of the one or more electrical contacts (e.g., 350, 750, 850), via a portion of the bumps (e.g., 313, 513, 713, 813) on the surface of the one or more electrical contacts, thereby forming wire-bonded connections (1020). The die is coated with a polymeric material (1030). A portion of the coating is polished (1040).

FIG. 11 is a workflow 1100 that is a more granular illustration of some examples of forming the bumps (e.g., FIG. 10, 1010). In this example, the method includes forming the bumps includes removing a top oxide layer from the upper surface of the die (1112). The method also includes forming a seed layer (e.g., 360, 760, 860) over the upper surface of the die (1114) (e.g., sputtering a material over the upper surface of the die). This example then includes implementing and patterning a photoresist (e.g., 370, 770, 870) on the active surface (e.g., 330, 730, 830) of the die, which is part of the upper surface, such that the seed layer is exposed on portions of the upper surface without the patterned photoresist (1115). In some examples, the forming includes electroplating a metal layer (e.g., 380, 780, 880) over the exposed seed layer which implements the metal layer over the electrical contacts (e.g., 350, 750, 850), forming the bumps (1116). Upon forming the bumps, the example of FIG. 11 then includes removing the photoresist (1117). Finally, in some examples, the method includes, removing a portion of the seed layer above the active surface (1118).

The seed layer may or may not be removed from the active surface using an etchant that preserves the nanowells. This seed layer may or may not be metal, including but not limited to, titanium tungsten (TiW), copper (Cu), titanium copper (TiCu), and/or titanium (Ti).

Some examples include layering a photoresist layer on the active surface of the die before forming the seed layer, this initial photoresist can be patterned over the active surface of the die (not shown in FIG. 10) (e.g., FIG. 7B, 770). In this example, a second photoresist layer (e.g., FIG. 7C, 772) may be patterned over the seed layer. As illustrated in FIGS. 7D-7E, the two photoresist layers 772, 770, and the seed layer 760, are all removed above the active surface 730.

Some examples include two photoresist layers, but one of the photoresist layers is patterned over an electrical contact and the other, over the active surface. FIGS. 8A-8E illustrate one of these types of examples.

In some examples of the method described herein, the method includes forming bumps on a surface of one or more electrical contacts, where the one or more electrical contacts are accessible on an upper surface of a die, where the die is oriented on a substrate, and where the electrical contacts comprise bonding pads. The method may also include coupling additional electrical contacts to the one or more electrical contacts, where the coupling comprises wire-bonding each additional electrical contact of the additional electrical contacts to one of the one or more electrical contacts accessible on the upper surface of the die, via a portion of the bumps on the surface of the one or more electrical contacts, thereby forming wire-bonded connections.

In some examples, the die is oriented on a substrate such that a first space is defined in a cavity adjacent to a first edge of the upper surface of the die and a second space is defined in a cavity adjacent to a second edge of the upper surface of the die, and wherein an under-fill layer comprises a cavity between the lower surface of the die and the substrate.

In some examples, the one or more electrical contacts comprise aluminum.

In some examples, the die comprises a complementary metal-oxide-semiconductor (CMOS).

In some examples, an active surface of the die comprises a portion of the upper surface of the die comprising nanowells, the one or more electrical contacts are adjacent to the active surface, and forming the bumps comprises: removing a top oxide layer from the upper surface of the die. The method may also include forming a seed layer over the upper surface of the die. The method may also include implementing and patterning a photoresist on the active surface of the die, where the seed layer is exposed on portions of the upper surface without the patterned photoresist. The method may also include electroplating a metal layer over the exposed seed layer, where the electroplating comprised implementing the metal layer over the one or more one or more electrical contacts.

In some examples, the method also includes prior to forming the seed layer, forming and patterning an initial photoresist over the active surface of the die.

In some examples, the method also includes removing the photoresist from the portion of the upper surface.

In some examples, the active surface comprises a nanowell array. The method may also include removing the seed layer from the active surface by utilizing an etchant that preserves the nanowell array.

In some examples, the method also includes removing the initial photoresist.

In some examples removing the photoresist comprises using ultraviolet (UV) light to break down photoresist crosslinks and removing the photoresist by applying a developer to the die.

In some examples, forming the seed layer comprises sputtering a material over the upper surface of the die.

In some examples, the seed layer is comprised of metal.

In some examples, a material comprising the seed layer is selected from the group consisting of: titanium tungsten (TiW), copper (Cu), titanium copper (TiCu), and titanium (Ti).

In some examples, a material comprising the bumps is selected from the group consisting of: gold (Au), platinum (Pt), copper (Cu), and nickel (Ni).

In some examples, the method also includes coating the die with a polymeric material; and polishing a portion of the coating.

In some examples, the one or more additional electrical contacts comprise substrate bonding pads and the one or more electrical contacts comprise die bonding pads.

In some examples, wherein the die comprises coated and polished nanowells.

Some examples of the apparatus described herein may include a substrate comprising a die, where the die is oriented on the substrate, where one or more electrical contacts comprising bonding pads are oriented on an upper surface of the die, where a portion of an upper surface of each of the one or more electrical contacts is layered with a coating comprising metal bumps. The apparatus may also include one or more additional electrical contacts, each of the one or more additional electrical contacts electrically coupled, via a wire bond, to at least one electrical contact of the or more one or more electrical contacts, via a portion of the metal bumps on the at least one contact. The apparatus may also include a fluidic flow channel over an active surface of the die, where the active surface of the die comprises a portion of the upper surface of the die comprising nanowells, where the one or more electrical contacts are adjacent to the active surface.

In some examples, the metal of the metal coating is selected from the group consisting of: gold (Au), platinum (Pt), copper (Cu), and nickel (Ni).

In some examples, the die comprises a complementary metal-oxide-semiconductor (CMOS).

Some examples of the method herein include forming bumps on a surface of one or more bonding pads, where the one or more bonding pads are accessible on an upper surface of a sensor utilized in a flow cell, where a portion of a top surface of the sensor comprises an active surface, where the one or more bonding pads are located adjacent to the active surface. The former may include: removing a top oxide layer from the upper surface of the sensor. The method may also include forming a seed layer over the upper surface of the sensor. The method may also include implementing and patterning a photoresist on the active surface of the sensor, where the seed layer is exposed on portions of the upper surface without the patterned photoresist. The method may also include electroplating a metal layer over the exposed seed layer, where the electroplating comprised implementing the metal layer over the one or more bonding pads.

In some examples, the method also includes: prior to forming the seed layer, forming and patterning an initial photoresist over the active surface of the sensor.

In some examples, the method also includes: removing the photoresist from the portion of the upper surface.

In some examples, the active surface comprises a nanowell array, and the method further comprising: removing the seed layer from the active surface by utilizing an etchant that preserves the nanowell array.

In some examples, the method also includes removing the initial photoresist from over the active surface of the sensor.

In some examples, removing the photoresist comprises using ultraviolet (UV) light to break down photoresist crosslinks and removing the photoresist by applying a developer to the sensor.

In some examples, forming the seed layer comprises sputtering a material over the upper surface of the sensor.

In some examples, a material comprising the seed layer is selected from the group consisting of: titanium tungsten (TiW), copper (Cu), titanium copper (TiCu), and titanium (Ti).

In some examples, a material comprising the bumps is selected from the group consisting of: gold (Au), platinum (Pt), copper (Cu), and nickel (Ni).

In some examples, the method includes coating the die with a polymeric material; and polishing a portion of the coating.

In some examples, the method also includes: utilizing the bumps on the bonding pads to couple additional electrical contacts to the bonding pads, wherein the coupling comprises wire-bonding each additional electrical contact of the additional electrical contacts, to one of the bonding pads on the surface of the sensor, via the bumps, thereby forming wire-bonded connections.

In some examples, the sensor comprises a complementary metal-oxide-semiconductor.

In some examples, the active surface comprises coated and polished nanowells.

Some example of the method disclosed herein include: forming bumps on a surface of one or more bonding pads, where the one or more bonding pads are accessible on an upper surface of a sensor utilized in a flow cell, where a portion of a top surface of the sensor comprises an active surface, where the one or more bonding pads are located adjacent to the active surface. The forming may include removing a top oxide layer from the upper surface of the sensor. The method may also include forming a seed layer over the upper surface of the sensor, where the forming forms a first portion of the seed layer on the one or more bonding pads and a second portion of the seed layer on the active surface; implementing and patterning a first photoresist on one or more bonding pads. The method may also include removing the second portion of the seed layer. The method may also include implementing and patterning a second photoresist on the active surface of the sensor. The method may also include electroplating a metal layer over the first portion of the seed layer, where the electroplating comprised implementing the metal layer over the one or more bonding pads. The method may include stripping the second photoresist. The method may include stripping a section of the first portion of the seed layer, where the section is not covered by the metal layer.

In some examples, the method also includes: utilizing the bumps on the bonding pads to couple exposed electrical contacts to the bonding pads, where the coupling comprises wire-bonding each exposed electrical contact of the exposed electrical contacts, to one of the bonding pads on the surface of the CMOS, forming wire-bonded connections.

The flowchart and block diagrams in the Figures illustrate the architecture, functionality, and operation of possible implementations of systems, methods, and computer program products according to various examples of the present implementation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, processes, operations, elements, and/or components, but do not preclude the presence or addition of one or more other features, integers, steps, processes, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more examples has been presented for purposes of illustration and description, but is not intended to be exhaustive or limited to in the form disclosed. Many modifications and variations will be apparent to those of ordinary skill in the art. The example was chosen and described in order to best explain various aspects and the practical application, and to enable others of ordinary skill in the art to understand various examples with various modifications as are suited to the particular use contemplated.

It should be appreciated that all combinations of the foregoing concepts and additional concepts discussed in greater detail below (provided such concepts are not mutually inconsistent) are contemplated as being part of the subject matter disclosed herein at least to achieve the benefits as described herein. In particular, all combinations of claims subject matter appearing at the end of this disclosure are contemplated as being part of the subject matter disclosed herein. It should also be appreciated that terminology explicitly employed herein that also may appear in any disclosure incorporated by reference should be accorded a meaning most consistent with the particular concepts disclosed herein.

This written description uses examples to disclose the subject matter, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the above description is intended to be illustrative, and not restrictive. For example, the above-described examples (and/or aspects thereof) may be used in combination with each other. In addition, many modifications may be made to adapt a particular situation or material to the teachings of the various examples without departing from their scope. While the dimensions and types of materials described herein are intended to define the parameters of the various examples, they are by no means limiting and are merely provided by way of example. Many other examples will be apparent to those of skill in the art upon reviewing the above description. The scope of the various examples should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Forms of term "based on" herein encompass relationships where an element is partially based on as well as relationships where an element is entirely based on. Forms of the term "defined" encompass relationships where an element is partially defined as well as relationships where an element is entirely defined. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular example. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the subject matter has been described in detail in connection with only a limited number of examples, it should be readily understood that the subject matter is not limited to such disclosed examples. Rather, the subject matter can be modified to incorporate any number of variations, alterations, substitutions or equivalent arrangements not heretofore described, but which are commensurate with the spirit and scope of the subject matter. Additionally, while various examples of the subject matter have been described, it is to be understood that aspects of the disclosure may include only some of the described examples. Also, while some examples are described as having a certain number of elements it will be understood that the subject matter can be practiced with less than or greater than the certain number of elements. Accordingly, the subject matter is not to be seen as limited by the foregoing description, but is only limited by the scope of the appended claims.

What is claimed is:

1. A method comprising:
    forming bumps on a surface of one or more electrical contacts, wherein the one or more electrical contacts are accessible on an upper surface of a die, wherein an active surface of the die comprises a portion of the upper surface of the die comprising nanowells, wherein the one or more electrical contacts are adjacent to the active surface, wherein the electrical contacts comprise bonding pads, and wherein forming the bumps comprises:
        removing a top oxide layer from the upper surface of the die;
        forming a seed layer over the upper surface of the die;

implementing and patterning a photoresist on the active surface of the die, wherein the seed layer is exposed on portions of the upper surface without the patterned photoresist; and electroplating a metal layer over the exposed seed layer, wherein the electroplating comprises implementing the metal layer over the one or more electrical contacts; and coupling additional electrical contacts to the one or more electrical contacts, wherein the coupling comprises wire-bonding each additional electrical contact of the additional electrical contacts to one of the one or more electrical contacts accessible on the upper surface of the die, via a portion of the bumps on the surface of the one or more electrical contacts, thereby forming wire-bonded connections.

2. The method of claim 1, wherein the die is oriented on a substrate such that a first space is defined in a cavity adjacent to a first edge of the upper surface of the die and a second space is defined in a cavity adjacent to a second edge of the upper surface of the die, and wherein an under-fill layer comprises a cavity between the lower surface of the die and the substrate.

3. The method of claim 1, wherein the one or more electrical contacts comprise aluminum.

4. The method of claim 1, wherein the die comprises a complementary metal-oxide-semiconductor (CMOS).

5. The method of claim 1, further comprising:
prior to forming the seed layer, forming and patterning an initial photoresist over the active surface of the die.

6. The method of claim 1, further comprising:
removing the photoresist.

7. The method of claim 6, wherein the active surface comprises a nanowell array, the method further comprising:
removing the seed layer from the active surface by utilizing an etchant that preserves the nanowell array.

8. The method of claim 7, further comprising:
removing the initial photoresist from over the active surface of the die.

9. The method of claim 1, wherein removing the photoresist comprises using ultraviolet (UV) light to break down photoresist crosslinks and removing the photoresist by applying a developer to the die.

10. The method of claim 1, wherein forming the seed layer comprises sputtering a material over the upper surface of the die.

11. The method of claim 1, wherein the seed layer is comprised of metal.

12. The method of claim 1, wherein a material comprising the seed layer is selected from the group consisting of: titanium tungsten (TiW), copper (Cu), titanium copper (TiCu), and titanium (Ti).

13. The method of claim 1, wherein a material comprising the bumps is selected from the group consisting of: gold (Au), platinum (Pt), copper (Cu), and nickel (Ni).

14. The method of claim 7, further comprising:
coating the die with a polymeric material; and
polishing at least a portion of the coating.

15. The method of claim 1, wherein the one or more additional electrical contacts comprise substrate bonding pads and the one or more electrical contacts comprise die bonding pads.

16. The method of claim 1, wherein the die comprises coated and polished nanowells.

17. An apparatus comprising:
a substrate comprising a die, wherein the die is oriented on the substrate, wherein one or more electrical contacts comprising bonding pads are oriented on an upper surface of the die, and wherein a portion of an upper surface of each of the one or more electrical contacts is layered with a coating comprising metal bumps, wherein the metal bumps comprise an electroplated metal layer over exposed portions of a seed layer formed over the upper surface of the die, wherein the unexposed portions of the seed layer are patterned with a photoresist;

one or more additional electrical contacts, each of the one or more additional electrical contacts electrically coupled, via a wire bond, to at least one electrical contact of the or more one or more electrical contacts, via a portion of the metal bumps on the at least one contact; and a fluidic flow channel over an active surface of the die, wherein the active surface of the die comprises a portion of the upper surface of the die comprising nanowells, wherein the one or more electrical contacts are adjacent to the active surface.

18. The apparatus of claim 17, wherein the metal of the metal coating is selected from the group consisting of: gold (Au), platinum (Pt), copper (Cu), and nickel (Ni).

19. The apparatus of claim 18, wherein the die comprises a complementary metal-oxide-semiconductor (CMOS).

* * * * *